US011275132B2

(12) United States Patent
Chen et al.

(10) Patent No.: US 11,275,132 B2
(45) Date of Patent: Mar. 15, 2022

(54) APPARATUS AND METHOD FOR TUNING THE PERMITTIVITY OF ULTRAHIGH DIELECTRIC CONSTANT MATERIALS IN AN RF COIL FOR MR IMAGING

(71) Applicants: REGENTS OF THE UNIVERSITY OF MINNESOTA, Minneapolis, MN (US); The Penn State Research Foundation, University Park, PA (US)

(72) Inventors: Wei Chen, Minneapolis, MN (US); Byeong-Yeul Lee, Minneapolis, MN (US); Xiao-Hong Zhu, Minneapolis, MN (US); Hannes M. Wiesner, Minneapolis, MN (US); Michael T. Lanagan, University Park, PA (US); Qing X. Yang, University Park, PA (US); Sebastian Rupprecht, University Park, PA (US); Navid P. Gandji, University Park, PA (US); Maryam Sarkarat, University Park, PA (US)

(73) Assignees: REGENTS OF THE UNIVERSITY OF MINNESOTA, Minneapolis, MN (US); The Penn State Research Foundation, University Park, PA (US)

( * ) Notice: Subject to any disclaimer, the term of this patent is extended or adjusted under 35 U.S.C. 154(b) by 0 days.

(21) Appl. No.: 16/843,681

(22) Filed: Apr. 8, 2020

(65) Prior Publication Data
US 2020/0319275 A1   Oct. 8, 2020

Related U.S. Application Data

(60) Provisional application No. 62/830,868, filed on Apr. 8, 2019.

(51) Int. Cl.
*G01R 33/34* (2006.01)
*G01R 33/54* (2006.01)

(52) U.S. Cl.
CPC ....... *G01R 33/34007* (2013.01); *G01R 33/34* (2013.01); *G01R 33/34015* (2013.01); *G01R 33/543* (2013.01)

(58) Field of Classification Search
CPC .............. G01R 33/34007; G01R 33/34; G01R 33/34015; G01R 33/543; G01R 33/3415; G01R 33/34046; G01R 33/3635
See application file for complete search history.

(56) References Cited

U.S. PATENT DOCUMENTS

| 5,017,872 A | 5/1991 | Foo |
| 8,798,719 B2 | 8/2014 | Yang |

(Continued)

FOREIGN PATENT DOCUMENTS

| EP | 2669697 A2 * | 12/2013 | ....... G01R 33/34084 |
| WO | 2018187040 A1 | 10/2018 | |

OTHER PUBLICATIONS

Song, Zhe, et al. "The role of microstructure on microwave dielectric properties of (Ba, Sr) TiO3 ceramics." Journal of the American Ceramic Society 99.3 (2016): 905-910. (Year: 2016).*

(Continued)

*Primary Examiner* — Rishi R Patel
(74) *Attorney, Agent, or Firm* — Quarles & Brady LLP

(57) ABSTRACT

An apparatus for transmitting and receiving radiofrequency (RF) signals in a magnetic resonance imaging system for proton and X-nuclear imaging includes at least one radiofrequency (RF) coil and an ultrahigh dielectric constant material incorporated within the at least one RF coil. The permittivity of the ultrahigh dielectric constant material depends on a temperature of the material and is tunable. The apparatus also includes a temperature controller that is thermally coupled to the ultrahigh dielectric constant material. The temperature controller is configured to control a temperature of the ultrahigh dielectric constant material to (Continued)

tune and optimize the permittivity of the ultrahigh dielectric constant material. A chemical structure and composition of the ultrahigh dielectric constant material is selected to control and optimize the permittivity and a dielectric loss of the ultrahigh dielectric constant material and a temperature dependence of the ultrahigh dielectric constant material. The apparatus provides denoising effect, high RF coil transmission and reception efficiencies, and improved signal-to-noise ratio for magnetic resonance or spectroscopic imaging applications and has a potential to advance clinical imaging for diagnosis.

26 Claims, 18 Drawing Sheets
(13 of 18 Drawing Sheet(s) Filed in Color)

(56) References Cited

U.S. PATENT DOCUMENTS

| | | |
|---|---|---|
| 2013/0202079 A1 | 8/2013 | Yu |
| 2015/0038831 A1 | 2/2015 | Yang |

OTHER PUBLICATIONS

Kao, Ting-Hui, et al. "Electronic phase transition between localized and itinerant states in the solid-solution system CaCu 3 Ti 4- x Ru x O 12." Physical Review B 95.19 (2017): 195141. (Year: 2017).*

Luo, Wei, et al. "Permittivity and performance of dielectric pads with sintered ceramic beads in MRI: early experiments and simulations at 3 T." Magnetic resonance in medicine 70.1 (2013): 269-275. (Year: 2013).*

Koolstra, K. et al, "Improved image quality and reduced power deposition in the spine at 3 T using extremely high permittivity materials", Magn. Reson. Med., vol. 79, No. 2, pp. 1192-1199, Feb. 2018.

Lee B.-Y. et al. Improving B1 Field Efficiency and Reducing noise for In Vivo 31P MRSI with Ultrahigh Dielectric Constant Material. Proc. Intl. Soc. Mag. Reson. Med. 25 (2017) 0746.

Lee B.-Y. et al. (2017) Large improvement of RF transmission efficiency and reception sensitivity for human in vivo 31P MRS imaging using ultrahigh dielectric constant materials at 7T. Magn Reson Imaging 42:158-163.

Rupprecht, S. et al. Drastic Enhancement and Manipulation of RF Field with Ultra High Dielectric Constant (uHDC) Material at 3T. Proceeding of Annual Meeting of International Society for Magnetic Resonance in Medicine (ISMRM) 2013; 21: p. 396.

Rupprecht, S. et al, "Improvements of transmit efficiency and receive sensitivity with ultrahigh dielectric constant (uHDC) ceramics at 1.5 T and 3 T", Magn. Reson. Med., vol. 79, No. 5, pp. 2842-2851, May 2018.

Sengupta L.C. et al, "Breakthrough advances in low loss tunable dielectric materials", Mater. Res. Innov., vol. 2, No. 5, pp. 278-282, Apr. 1999.

Snaar JE, et al. Improvements in high-field localized MRS of the medial temporal lobe in humans using new deformable high-dielectric materials. NMR in biomedicine 2011;24:873-879.

Tagantsev, A.K. et al, "Ferroelectric materials for microwave tunable applications", J. Electroceram., vol. 11, No. 1, pp. 5-66, Sep. 2003.

Webb AG. Dielectric materials in magnetic resonance. Concepts in Magnetic Resonance Part A 2011;38A:148-184.

Yang Q.X. et al, Radiofrequency field enhancement with high dielectric constant (HDC) pads in a receive array coil at 3.0T. J Magn Reson Imaging 2013;38:435-440.

Yang Q.X. et al, Reducing SAR and enhancing cerebral signal-to-noise ratio with high permittivity padding at 3 T. Magnetic Resonance in Medicine 2011;65:358-362.

Yang Q.X. et al., "Manipulation of image intensity distribution at 7.0 T: Passive RF shimming and focusing with dielectric materials", J. Magn. Reson. Imag., vol. 24, No. 1, pp. 197-202, Jul. 2006.

Yang Q. et al. MRI Enhancement via high dielectric constant pad at 3T: Brain imaging. Proceedings of ISMRM 20 (2012) p. 2702.

Zhang, J.J. et al, "Microwave dielectric properties and low sintering temperature of Ba0.5Sr0.5TiO3-Mg2TiO4 composites synthesized in situ by the hydrothermal method", Ceram. Int., vol. 39, No. 5, pp. 5943-5948, 2013.

* cited by examiner

702

704

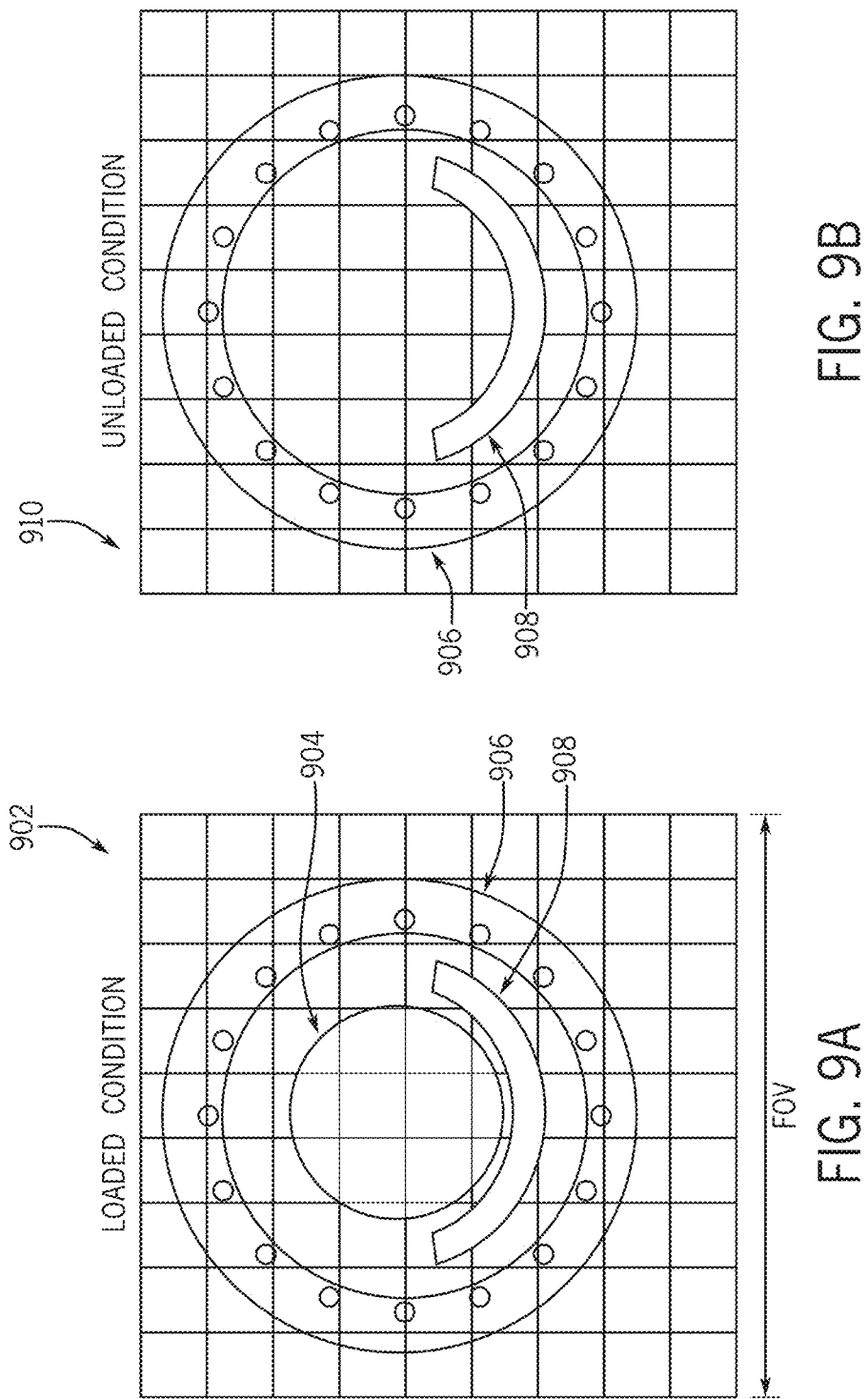

APPARATUS AND METHOD FOR TUNING THE PERMITTIVITY OF ULTRAHIGH DIELECTRIC CONSTANT MATERIALS IN AN RF COIL FOR MR IMAGING

CROSS-REFERENCE TO RELATED APPLICATIONS

This application is based on, claims priority to, and incorporates herein by reference in its entirety U.S. Ser. No. 62/830,868 filed Apr. 8, 2019, and entitled "Apparatus and Method for Tuning the Permittivity of Ultrahigh Dielectric Constant Materials in an RF Coil."

STATEMENT REGARDING FEDERALLY SPONSORED RESEARCH

This invention was made with government support under EB026978 and MH106049 awarded by the National Institutes of Health. The government has certain rights in the invention.

BACKGROUND

Magnetic resonance (MR) imaging (MRI) provides a prominent imaging modality for biomedical research and clinical diagnosis. There are a large variety of MRI methods based on the types of MR signals detected. One of the most popular MM methods relies on the detection of abundant tissue water proton nuclide ($^1$H) signal for imaging organ structures and pathophysiology and is highly valuable for diagnosis. Another category of MR imaging approaches is in vivo MR spectroscopy (MRS) or imaging (MRSI) which detect $^1$H and X-nuclear (e.g., $^{17}$O, $^2$H, $^{13}$C, $^{23}$Na and $^{31}$P nuclides) resonance signals for assessing biochemical and metabolites in tissues of interest. For example, in vivo $^1$H MRS(I) is highly valuable for studying brain cellular metabolites with abundant protons such as creatine, N-acetylaspartic acid, and neurotransmitters of glutamate, glutamine, and gamma-aminobutyric acid. In contrast, in vivo $^{31}$P MRS(I) can detect endogenous tissue phosphate metabolites such as high-energy phosphate molecules of adenosine triphosphate (ATP) and phosphocreatine, the $ATP_{ase}$ and creatine kinase enzyme activity, as well as measure brain intracellular nicotinamide adenine dinucleotide in oxidized (NAD$^+$) and reduced (NADH) forms, and, thus, determine the NAD redox ratio in vivo. Another family of X-nuclear MRS methods requires administration of exogenous substrates for studying energy metabolism and metabolic rates: e.g., combining $^{13}$C or $^2$H MRS(I) with $^{13}$C- or $^2$H-isotope labeled glucose/acetate or hyperpolarized $^{13}$C-pyruvate for assessing the cerebral metabolic rate of glucose and TCA cycle rate, or production rate of lactate from pyruvate; or combining $^{17}$O MRS(I) with inhalation of $^{17}$O-isotope labeled oxygen gas for simultaneously imaging the cerebral metabolic rate of oxygen, cerebral blood flow and oxygen extraction fraction. These advanced metabolic imaging techniques provide a rich matrix of in vivo measurements and parameters with explicit physiological meanings and quantities for studying organ metabolism and pathophysiology, and have shown a potential for translation and clinical applications.

However, MR imaging faces a fundamental challenge, namely, low intrinsic detection sensitivity owing to an extremely small energy difference between the excited and ground states of the nuclear spins. The signal-to-noise ratio (SNR) of the MR signal detected by a radiofrequency (RF) transmit-receive coil(s) from an object can be expressed as:

$$SNR = \frac{MR \text{ signal from sample}}{\text{Noise}} \propto \gamma^2 \cdot B_0^2 [\sin(\alpha)] \frac{B_1^-}{\sqrt{P_s + P_c}} \propto B_0^\beta; \quad \text{Eq. [1]}$$

$$\alpha = \gamma \cdot C \cdot \tau \cdot B_1^+ \cdot V,$$

where $\gamma$ is the gyromagnetic ratio, $B_0$ is the static magnetic field strength of a MM magnet, $\alpha$ is the radiofrequency (RF) pulse flip angle produced by the RF coil transmission field $B_1^+$ driven by 1 volt of RF pulse voltage (V); $\tau$ is the RF pulse width, C is the pulse waveform correction factor (e.g., =1 for a hard pulse shape, <1 and >0 for other RF pulse shapes), and $B_1^-$ is the RF magnetic field of RF coil reception and it determines the signal amplitude or detection sensitivity. On the other hand, $B_1^+$ determines the RF transmission efficiency. The noise is determined by the dissipated RF power in the sample ($P_S$) and the receive coil ($P_C$). It is proportional to the multiplier term of the material electrical conductivity ($\sigma$) and the electric field strength of the RF field (E) produced by the RF coil in the object. Together, the term of $B_1^- \sqrt{P_s + P_c}$, in Eq. [1] refers to receive sensitivity. For high-$\gamma$ nuclides, such as $^1$H with a highest $\gamma$ value, $P_S \gg P_C$ and $\sqrt{P_s} \propto \gamma B_0$, thus, $SNR \propto \gamma B_0$ approximately or linear $B_0$ dependence according to Eq. [1]. In contrast, for low-$\gamma$ nuclides (e.g., $^{17}$O or $^2$H having a $\gamma$ value of 6-7 times lower than that of $^1$H), the noise contribution from the RF coil becomes significant and $\sqrt{P_s + P_c} \propto (\gamma B_0)^{1/4}$, thus, $SNR \propto \gamma B_0^{7/4}$ approximately. Therefore, a key objective in the development of MR imaging technology is to use all possible strategies as guided by Eq. [1] to improve SNR, thus, imaging resolution and reliability.

One of the most effective but very expensive strategies is to develop high or ultrahigh field (UHF) MR imaging technology for achieving a significant SNR gain because SNR is proportional to $B_0^\beta$, where the power $\beta$ ranges approximately from ~1 for $^1$H MRI/MRS(I) to ~7/4 for $^{17}$O and $^2$H MRS(I). Significant research efforts and funds have been dedicated to advance the human MR scanner technology from high field at 3 Tesla (T) or 4 T to UHF of 7 T, 9.4 T and now to 10.5 T for improving MRI sensitivity, spatial and temporal resolution, and spectral resolution of MRS(I). However, the sensitivity gain is still limited even at UHF for many MR imaging applications or diagnosis. For instance, the apparent SNRs for human brain $^1$H MRI and in vivo $^{31}$P MRS have approximately linear dependence on $B_0$ from 4 T to 7 T. UHF MRI technology with a field strength beyond 10 T provides an exciting opportunity to further push the limit of spatiotemporal resolution because the detection sensitivity will be improved significantly at such high field strength. Nevertheless, the anticipated sensitivity gains at 10.5 T as compared to that of a 7 T human scanner may be still limited (~50-100%) for human MRI applications, which is estimated based on the field dependence of $SNR \propto B_0^\beta$, where $\beta$ is ranging from 1 to 7/4.

Various alternative engineering solutions, especially at UHF, have been developed to further improve MR imaging SNR. For example, combining high dielectric constant (HDC) or ultrahigh HDC (uHDC) materials with RF coils has demonstrated a new utility for improving the efficiency of RF transmission ($B_1^+$) and reception ($B_1^-$) fields, and therefore, the detection sensitivity and SNR of MR imaging.

The physics and effects of uHDC materials on RF magnetic field and MR signal can be described by the following Maxwell's equations, $$\oint_l B_1 \cdot d\ell = \mu \int\int_S \sigma E \cdot dS + \mu \frac{\partial}{\partial t} \int\int_S \varepsilon_r \varepsilon_0 E \cdot dS \quad \text{Ampere's Law} \quad \text{Eq. [2]}$$

$$\oint_L E \cdot d\ell = -\frac{\partial}{\partial t} \int\int_A B_1 \cdot dS \quad \text{Faraday's Law} \quad \text{Eq. [3]}$$

where $\varepsilon_r$ is the relative electric permittivity or dielectric constant, and $\varepsilon_0$ (=1) is the permittivity of free space. The first term (CE) on the right side of Eq. [2] is the conductive current density ($J_c$), and the second term $$\left(\frac{\partial}{\partial t}\varepsilon_r\varepsilon_0 E\right)$$

is the displacement current density ($J_d$); and they are the sources attributed to the RF magnetic field $B_1$. Conventionally, most of the RF coil engineering has been focused on the first term: i.e., how to induce the RF magnetic field efficiently with the conductive current in a RF coil, while the displacement current is commonly disregarded since $J_d$ is relatively small in air with $\varepsilon_r \approx 1$ in the RF regime for MR imaging applications, for instance, 128 MHz for $^1$H MRI at 3 T or 120 MHz for $^{31}$P MRSI at 7 T. Since $J_d$ is proportional to $\varepsilon_r$, uHDC material with, for instance, several hundred- or thousand-fold $\varepsilon_r$ of air would largely enhance the $J_d$ contribution, and generate much stronger $B_1$ field. Under the near-field condition, insertion of the uHDC material near a biological sample can result in: i) increased $B_1$ for improving MR detection sensitivity (or SNR, Eq. [1]) and $B_1^+$ for improving RF transmission efficiency, leading to a reduction in the RF power input required to generate a desired RF pulse flip angle, which concurrently reduces the specific RF power absorption rate (SAR); and ii) increased $B_1/E$ ratio in its vicinity in the sample, thus, potentially reducing the E field, associated coil and sample noises.

A dielectric material pad positioned around the human head, spine or any other body parts during an MRI scan can improve image SNR and resolution or reduce scan time, meanwhile reduce RF energy deposition or SAR to make MRI safer. The improvement in the image caused by the dielectric pad depends on several factors, including the geometric dimensions and dielectric permittivity and loss of the pad at a given static magnetic field strength or RF operation frequency. The permittivity requirement depends on the RF operation frequency, which in turn depends on the static magnetic field strength and nuclear species (nuclides), such as proton ($^1$H) or phosphorous ($^{31}$P). Several approaches have been attempted to increase the permittivity with water-based mixtures of powders or beads of dielectric materials. To further increase permittivity, a transition to high-density and low-loss composite dielectric materials is necessary. Most recently, it has been demonstrated that for $^1$H MRI at 3.0 T and $^{31}$P MRS at 7 T (similar MR operation frequencies for both cases), a significant reduction of RF transmission power and SNR improvement could be achieved using monolithic ceramics with ultrahigh permittivity (on the order of thousands). For dielectric pads used for $^1$H MRI at higher static magnetic field strengths or UHF, their optimal permittivity values tend to be lower, for example, on the order of hundreds at 7 T or higher field strength.

Consistent with Eqs. [2] and [3], the optimal permittivity value ($\varepsilon_r$) has approximately an inverse relationship with the square power of MR operation frequency; for instance, compared to the proton MRI at 7 T ($\varepsilon_r \sim 200$ and at an RF operation frequency of ~300 MHz), a much higher permittivity for optimal $^1$H MRI/MRSI and X-nuclear MRS(I) applications with a low RF operation frequency is required even at ultrahigh field (e.g., $\varepsilon_r > 1000$ for $^{31}$P MRS(I) at 7 T or $^1$H MRS(I) at 3 T operated in a Lamor frequency range of 120-130 MHz; >6000 for $^{17}$O MRS(I) at 10.5 T or $^1$H MRS(I) at 1.5 T operated in a Lamor frequency range of 60-65 MHz; and >10000 for $^2$H MRS(I) at 7 T or $^1$H MRI/MRSI at 1 T operated in a Larmor frequency range of 43-46 MHz). This demands new types of low dielectric loss uHDC materials offering extremely high permittivity for broad MR imaging applications at varied magnetic field strengths.

In addition, when the uHDC pad(s) self-resonant frequency approaches the RF coil operation frequency, the uHDC pad(s) could be electrically coupled to the RF coil(s) and degrade the RF coil quality factor (Q) and performance, and, thus, should be avoided in the uHDC pad design and fabrication process if possible or avoid the overlapping between the RF coil operation frequency and the uHDC self-resonant frequency for a desired MR imaging application.

The integrated uHDC-RF-coil approach could provide a cost-effective engineering solution for significantly improving RF coil transmission efficiency, MR imaging detection sensitivity, signal-to-noise ratio (SNR) and spatiotemporal resolution. However, the current state-of-the-art uHDC technology employs fixed permittivity uHDC pads with suboptimal performance owing to the uncertainty in determining an optimal uHDC permittivity value for a MR imaging application of interest, as well as relatively low permittivity value for the available dielectric materials aiming for many MR imaging applications operated at relatively low Larmor frequency; therefore, it is not optimal and inflexible for achieving a desired permittivity value and good performance. Furthermore, the high dielectric loss of the uHDC materials currently available will result in a larger MR imaging noise, which limits the SNR gain.

There is a need for a system, apparatus, and method for tuning and optimizing the permittivity of uHDC materials with a low dielectric loss used in magnetic resonance imaging technologies, for example, permittivity-tunable uHDC (tuHDC) materials with dielectric loss in an RF coil(s) for achieving the best performance.

SUMMARY OF THE DISCLOSURE

In accordance with an embodiment, an apparatus for transmitting and receiving radiofrequency (RF) signals in a magnetic resonance (MR) imaging system for proton and X-nuclear imaging includes at least one radiofrequency (RF) coil and an ultrahigh dielectric constant material incorporated within the at least one RF coil. A permittivity of the ultrahigh dielectric constant material depends on a temperature of the material and is tunable. The apparatus further includes a temperature controller thermally coupled to the ultrahigh dielectric constant material. The temperature controller is configured to control a temperature of the ultrahigh dielectric constant material to tune the permittivity of the ultrahigh dielectric constant material. A chemical structure and composition of the ultrahigh dielectric constant material is selected to control and optimize the permittivity of the ultrahigh dielectric constant material and a temperature dependence of the ultrahigh dielectric constant material.

In accordance with another embodiment, an apparatus for transmitting and receiving radiofrequency (RF) signals in a magnetic resonance imaging (MRI) system includes at least one radiofrequency (RF) coil and a low dielectric loss ultrahigh dielectric constant material positioned within the at least one RF coil. A temperature of the ultrahigh dielectric constant material is optimized to produce a maximum denoising effect in MR signals detected by the at least one RF coil and increase signal-to-noise ratio (SNR) for MR imaging.

In accordance with another embodiment, a method for controlling and enhancing a signal-to-noise ratio of MR signals detected by at least one RF coil in a magnetic resonance imaging (MRI) system includes providing an ultrahigh dielectric constant material within the at least one RF coil, wherein the permittivity of the ultrahigh dielectric constant material depends on a temperature of the material and is tunable and controlling the temperature of the ultrahigh dielectric constant material to tune and optimize the permittivity of the ultrahigh dielectric constant material. A chemical structure and composition of the ultrahigh dielectric constant material is selected to control and optimize the permittivity and a dielectric loss of the ultrahigh dielectric constant material and a temperature dependence of the ultrahigh dielectric constant material.

BRIEF DESCRIPTION OF THE DRAWINGS

The patent or patent application file contains at least one drawing in color. Copies of this patent or patent application publication with color drawings will be provided by the office upon request and payment of the necessary fee. The present invention will hereafter be described with reference to the accompanying drawings, wherein like reference numerals denote like elements.

FIGS. 9A-9B are schematic illustrations of an apparatus to test the low-loss and curved uHDC pad for denoising three-dimensional (3D) $^{31}P$ MRSI at 7 T using the $^1H$-$^{31}P$ dual frequency RF TEM volume head coil under (A) loaded (inorganic phosphate (Pi) in water phantom) and (B) unloaded conditions, respectively in accordance with an embodiment;

DETAILED DESCRIPTION

Figure 1:
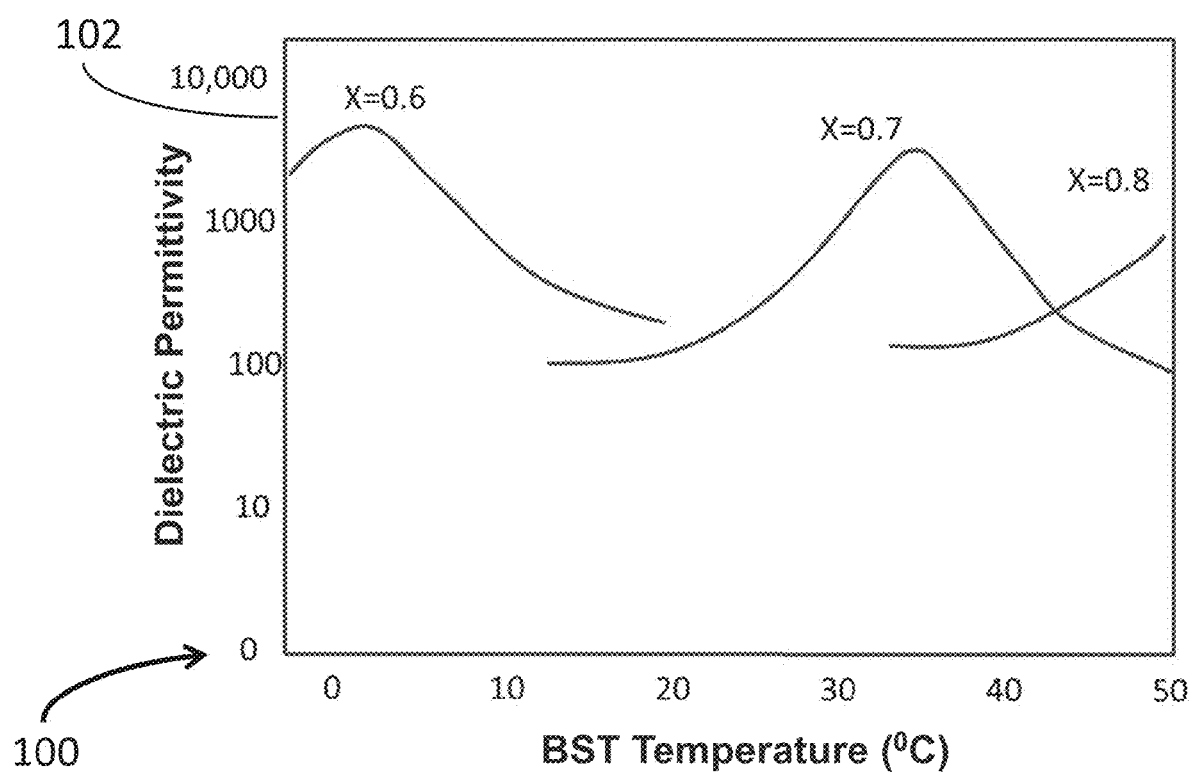
FIG. 1 is a graph schematically showing the temperature (T) dependent permittivity and large permittivity tunability of barium strontium titanate (BST, $Ba_xSr_{1-x}TiO_3$) ceramics as an example, where the material composition fraction value of x is set to, for example, 0.6, 0.7 or 0.8 for shifting the temperature dependence of the ceramics in accordance with an embodiment.

The present disclosure describes apparatus and methods to significantly enhance the capability of the magnetic resonance (MR) imaging technology for broad MM and/or in vivo MR spectroscopy imaging MRS(I) applications. In one embodiment, by incorporating low-loss and ultrahigh dielectric constant (uHDC) materials or ceramic pads with radiofrequency (RF) coil(s), a large denoising effect and signal-to-noise ratio (SNR) improvement can be achieved in detecting MR signals for MM and MRS(I). In another embodiment, by incorporating low-loss permittivity-tunable uHDC (tuHDC) materials or ceramic pads with RF coil(s) in which the material composition and properties and/or the material temperature can be adjusted or controlled to change the material dielectric constant or permittivity value across a large range, an optimal MR detection sensitivity and imaging performance can be achieved via improving the efficiency of RF transmission $B_1^+$ and reception $B_1^-$ fields, reducing the MR imaging noise level, and maximizing SNR and imaging resolution. In an embodiment, the tuHDC materials or ceramic pads are made of composite barium strontium titanate (BST) compounds ($Ba_{0.6}Sr_{0.4}TiO_3$, x=6) that have low dielectric loss and very high permittivity tunability from 2,000 to 15000 by varying the ceramic temperature between 0° C. to 40° C. It was determined that a large and spatially independent noise reduction occurs at an optimal uHDC and/or tuHDC ceramic temperature which resulted in SNR improvement of several folds. In other embodiments, various methods and devices for characterizing and optimizing the uHDC and/or tuHDC performance may be used that may ultimately improve the MR imaging quality.

The apparatus and methods described herein are robust and cost-effective, and may be applied in a broad spectrum of MRI/MRS(I) applications of different nuclides of biological interest at various magnetic field strengths. Improvements such as higher imaging detection sensitivity, reliability, spatial and temporal resolution will benefit basic and clinical MR imaging research, and more importantly, clinical diagnosis. The apparatus and methods overcome existing challenges for MRI and MRS(I) as described above by providing engineering methods to significantly improve the uHDC technology performance and SNR for a wide range of biomedical MR imaging applications using biologically interesting nuclides at various magnetic field strengths.

In an embodiment, low dielectric loss and high-quality factor (Q) uHDC materials or ceramic pad(s) are incorporated in RF coil(s) to achieve significant denoising effects, thus increasing SNR and spatiotemporal resolution for broad MRI and MRS(I) applications across different magnetic field strengths as demonstrated for $^{31}$P MRSI application at 7 T, $^{17}$O MRSI application at 10.5 T, $^{23}$Na MRSI application at 7 T. The low dielectric loss, high Q tuHDC materials and/or ceramic pad(s) may be designed, identified and fabricated to be permittivity-tunable with a large tuning permittivity range by either controlling the material chemical structure and material composites, and/or the material temperature within a safe temperature range for optimizing and improving MRI/MRS(I) performance. The present disclosure also describes methods to test, measure, characterize and optimize the properties of tuHDC materials and/or ceramic pad(s) for improving MRI/MRS(I) performance.

In another embodiment, tuHDC materials and/or ceramic pad(s) with varied material temperature may be employed within a safe temperature range. The optimal permittivity value of the tuHDC materials or the ceramic pad with a desired geometry may be determined to conform to the object for MRI/MRS(I) application operated at a desired RF resonant frequency for the nuclide of interest at a given field strength. A numerical method (or formula) may be used to guide the selection of optimal permittivity value of the tuHDC materials and/or ceramic pad(s) aiming for a particular MRI/MRS(I) application operated at a desired RF resonant frequency for the nuclide of interest at a given field strength. In another embodiment, low dielectric loss and high Q tuHDC materials or ceramic pad(s) may be incorporated with RF coil(s), and the material permittivity optimized by varying and controlling the material temperature within a safe temperature range for significantly increasing the RF coil transmission field ($B_1^+$) efficiency, thus, largely reducing the required RF power for acquiring MRI and MRS(I) at a desired RF resonant frequency for the nuclide of interest at a given field strength. In another embodiment, the material permittivity may be optimized by varying and controlling the material temperature within a safe temperature range for significantly increasing the RF coil reception field (13$i$) efficiency, thus, largely increasing the MR signal and detection sensitivity, ultimately, increasing SNR and/or imaging spatiotemporal resolution for MRI/MRS(I) application operated at a desired RF resonant frequency for the nuclide of interest at a given field strength. In another embodiment, the material permittivity may be optimized by varying and controlling the material temperature within a safe temperature range for achieving the maximum denoising effect for MM and MRS(I) application, thus, further increasing SNR and/or imaging spatiotemporal resolution.

In another embodiment, the low dielectric loss and high Q tuHDC materials or ceramic pad(s) is incorporated with RF coil(s), and the material permittivity optimized by varying and controlling the material composites and chemical structure for optimizing the temperature dependent function of the material permittivity to achieve optimal performance at a desired material temperature for increasing RF coil $B_1^+$ and $B_1^-$ efficiencies, denoising effect and SNR and/or imaging spatiotemporal resolution for MM and MRS(I) applications. In another embodiment, a method is disclosed that incorporates the low dielectric loss and high Q tuHDC materials or ceramic pad(s) is incorporated with RF coil(s), and the material permittivity optimized by varying and controlling the material composites and chemical structure for optimizing the material permittivity at the room temperature, thus, for increasing RF coil $B_1^+$ and $B_1^-$ efficiencies, denoising effect and SNR and/or imaging spatiotemporal resolution for MM and MRS(I) applications without the need of a temperature controller.

The present disclosure describes robust and cost-effective (t)uHDC methods integrated with RF coil(s) for achieving improvements for broad MR imaging applications. The methods described herein may be used to generate the integrated (t)uHDC-RF coil technology offering high SNR and performance, for instance, 2 or 4 times in SNR gain which could be translated to 2 or 4 times of improvement in spatiotemporal resolution, or 4- or 16-times less in clinical MRI scanning time without degrading imaging quality.

In accordance with various embodiments, fixed permittivity uHDC or permittivity tunable uHDC (tuHDC) materials or ceramic pads may be used with or incorporated into RF coils for various MR imaging applications. Table 1 lists a number of HDC/uHDC/tuHDC material examples for MR imaging applications with large variations in their permittivity and Q values. The PZT (Pb(Zr,Ti)O$_3$) material is commonly used as a piezoelectric material in ultrasound imaging and commercially available. Its permittivity could range from 930 to 3300 for PZT-based ceramics suitable for some MR imaging applications. The permittivity of PZT material is fixed and dielectric loss is usually very high (or low Q), potentially introducing a large detection noise thus reducing the degree of SNR improvement, though recent technical advancements could moderately reduce the dielectric loss of the PZT blocks for MR imaging applications.

TABLE 1

| Material | Permittivity | Q |
|---|---|---|
| Hard Pb(Zr,Ti)O$_3$ (PZT) | 930 | 30 |
| Soft Pb(Zr,Ti)O$_3$ (PZT) | 3300 | 10 |
| TiO$_2$ | 100 | 3000 |
| CaTiO$_3$ | 170 | 2000 |
| Ba$_{0.4}$Sr$_{0.6}$TiO$_3$ | 900 | 300 |
| Ba$_{0.6}$Sr$_{0.4}$TiO$_3$ | 4600 | 180 |

In order to achieve an optimal permittivity of HDC/uHDC materials and/or ceramic pads, it is desirable to have the capability to "tune" the dielectric permittivity once the pads are made. In an embodiment, the dielectric permittivity of the uHDC materials or pads may be tuned (tuHDC material and/or pads) via controlling the materials or pad(s) temperature, or controlling the material composites or chemical structure. Tuning the dielectric permittivity may be used to enhance MM and/or MRS(I) performance during scans. There are several criteria for the tunable dielectric materials or pad(s) including: (a) the dielectric constant or permittivity ($\varepsilon_r$) of the uHDC materials or pad(s) is tunable to a large range (for example, a few hundred to 18,000); (b) the dielectric constant may be varied through altering and controlling the temperature of the uHDC materials or pads; (c) the material or pad temperature range of operation should be, ideally, for example, within a safe range between 0 to 40° C., though it may be extended to a broader range using a well-designed temperature controller, thermal insulation and safety protection; (d) the MR imaging application of the uHDC/tuHDC materials should be optimized and operated under the paraelectric state; and (e) the dielectric loss is a measure of energy loss in the uHDC/tuHDC materials, which is a material property and does not depend on the geometry of the uHDC/tuHDC materials. The dielectric loss may be expressed as the loss tangent delta (tan δ) and should be small (tan δ<0.05) for MR imaging applications, and its dependence on temperature (T) and RF operation frequency (ω) is an important characteristic of material property, which should be considered in design and optimization. In the paraelectric state under the temperature situation of practical importance, the loss tangent obeys:

$$\tan\delta = \frac{\epsilon''}{\varepsilon_r} \propto \omega T^m \epsilon_r^{1.5} \qquad \text{Eq. [4]}$$

where $\epsilon''$ is the imaginary part of the dielectric permittivity and m is a power constant. The main contributions to dielectric loss are ionic conduction and ferroelectric domain wall motion of the dielectric material and they should be considered for design and fabrication of uHDC/tuHDC materials.

In an example, low-loss and high-Q ceramic materials based on the composite barium strontium titanate (BST) materials ($Ba_xSr_{1-x}TiO_3$), where x ranges from 0.2 to 0.8 for MR imaging applications, were identified and investigated for constructing the tuHDC block(s) (e.g., pad(s)) in which the $\epsilon_r$ value can be varied across a very large range by alternating and controlling the material temperature or the x value. Development of functional tuHDC ceramics may involve many processing variables, which include mixing powers of the desired material in the correct proportion (formulation), compressing them into desired shapes and then heat treating in high temperature (sintering) for an optimal period up to few days through a three-step (formulation-sintering-characterization) iterative process.

Figure 2A:
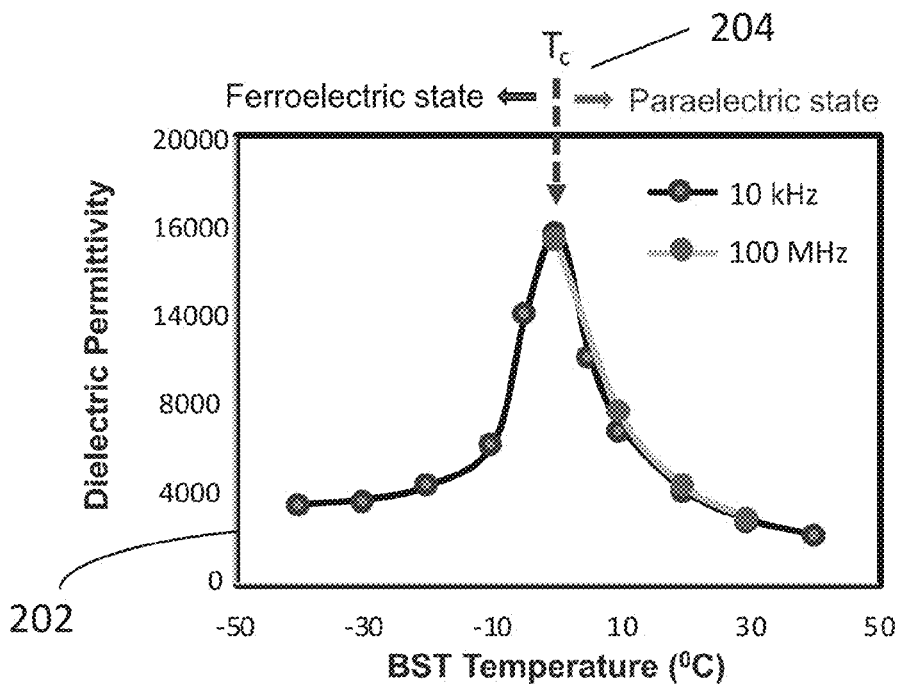
FIGS. 2A-2C illustrate results showing (A) the relative dielectric permittivity ($\varepsilon_r$) and (B) dielectric loss (tan δ) of barium strontium titanate (BST) ceramics (x=0.6) over a temperature range of −40° to 40° C. at 10 KHz or 100 MHz operation frequency, respectively, where dielectric permittivity and loss were maximized at the Curie Temperature ($T_c$~0° C.), the plots show very large permittivity tenability; and (C) an example plot of $Ln(\varepsilon_r)$ of BST vs. $Ln(T-T_c)$ for determining the Curie constant C in accordance with an embodiment.

BST ceramics may have a very high dielectric constant up to 10,000 at room temperature, that depends on the barium to strontium ratio (Ba/Sr ratio=x, 0<x<1) in the formulation of $Ba_xSr_{1-x}TiO_3$. The BST pad permittivity is governed by both the x value and operating temperature as shown in FIGS. 1 and 2A. FIG. 1 is a schematic graph 100 showing the temperature dependent permittivity of $Ba_xSr_{1-x}TiO_3$ (BST), where x is set to 0.6, 0.7 or 0.8. Note that the vertical axis 102 is log scale and the permittivity value can be changed by an order of magnitude within a 20° C. temperature range. The adjustment of the variable of x may be used to control the overall dielectric permittivity and dielectric loss of the BST block(s), and also may shift the BST paraelectric state to ferroelectric state (separated by Curie Temperature: $T_C$), for example, with large x value at room temperature (FIG. 1). Ferroelectric-state materials can experience a significant dielectric relaxation above 100 MHz, and degrade the MR imaging performance operated at 100 MHz, thus, it is desirable to avoid the state via designing and/or controlling.

The dielectric compositions can be tailored, e.g., by optimizing the x value, so that the Curie temperature is below the operating temperature of BST blocks(s), thus, operating under the paraelectric state. In another example, ferroelectric ceramics with a range of Curie Temperature are high permittivity constituents of the composite, and other candidate materials including perovskites, tungsten bronzes, and pyrochlores may be employed to tailor the relation between tunable $\epsilon_r$ and tuHDC temperature for achieving optimal MR imaging performance.

In various embodiments, BST-based tuHDC materials have several merits and improvements over existing methods or products. For example, current sintering processes may only achieve within the 10% range of the desired permittivity. The permittivity may be adjusted more precisely for given designs of dielectric BST block(s). In another example, for a given dielectric BST block, the permittivity may be tuned to a different permittivity value for different RF operating frequencies at different static magnetic fields or different nuclide species at the same static magnetic field. For a given dielectric BST block, the permittivity of certain parts of the BST pad may be tuned to a different permittivity value to shim the RF field distribution and/or to focus the RF field for different imaging purposes.

Figure 2B:
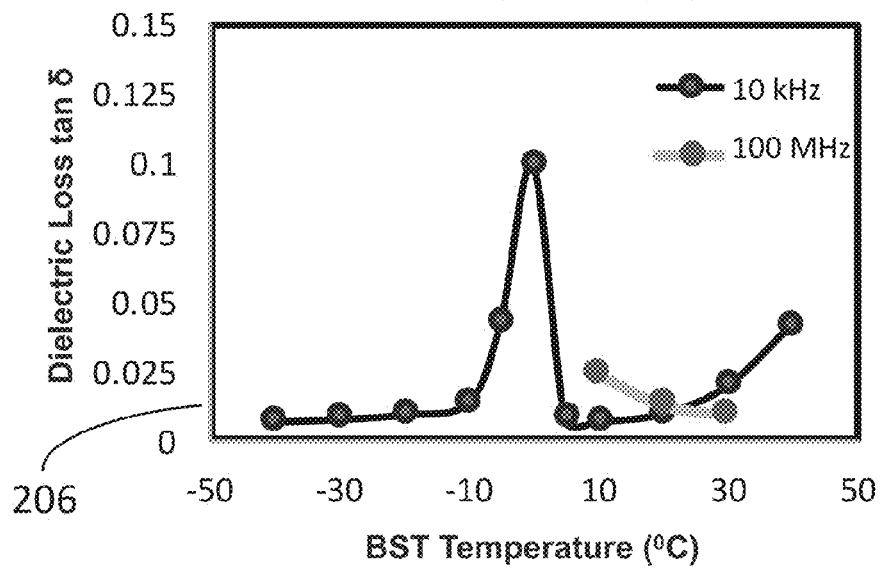

In an example, investigation, testing and characterization of the properties of tuHDC block(s) (e.g., pad(s)) made of tunable BST material, specifically, $Ba_{0.6}Sr_{0.4}TiO_3$ where x=0.6, was conducted and performance of the tuHDC pad(s) made of the BST material for improving MRI and MRS(I) at ultrahigh magnetic field (UHF) was validated. The BST block ($Ba_{0.6}Sr_{0.4}TiO_3$ where x=0.6) has a large $\epsilon_r$ value of 4500-4700 at the room temperature (20° C.), a high dielectric tunability from approximately 2000 to 16000 within a ~40° C. temperature range (as shown in FIG. 2A), and a very low dielectric loss (tan δ<0.03) at microwave and RF frequencies with the operation temperature range above the Curie temperature ($T_c \approx 0°$ C.) where the materials are in the paraelectric state (as shown in FIG. 2B).

In this example, the post resonator method of Hakki and Colman may be employed to measure the dielectric properties of $Ba_{0.6}Sr_{0.4}TiO_3$ or other uHDC materials in the microwave region for room temperature and temperature-dependent measurements. In the microwave region. This technique uses the specimen with a cylindrical form. The specimen is placed between two parallel conducting metal plate and two antennas positioned close to the sample. Dielectric permittivity and loss may be calculated from the measured BST microwave resonant frequency. The dielectric constant and quality factor (Q) were measured at different temperatures. The resonant frequency was varied by changing the temperature. In this example, as the temperature increased the BST self-resonant frequency varied from 40 MHz to 160 MHz. Table 2 presents dielectric permittivity ($\epsilon_r$) and dielectric loss (tan δ) data for the $Ba_{0.6}Sr_{0.4}TiO_3$ material measured at a high frequency of 70-100 MHz as well as at a low frequency at 10 KHz.

TABLE 2

| Temperature (° C.) | $\epsilon_r$ at 10 kHz | tan δ at 10 kHz | $\epsilon_r$ at 70-100 MHz | tan δ at 70-100 MHz |
|---|---|---|---|---|
| 40 | 2203.527 | 0.042 | | |
| 30 | 2857.77 | 0.02 | 2960 | 0.0093 |
| 20 | 4117.188 | 0.01 | 4383 | 0.0126 |
| 10 | 6945.789 | 0.0073 | 7625 | 0.0232 |
| 5 | 10127.14 | 0.008 | ## | |
| 0 | 15665.49 | 0.099 | 15304 | |
| -5 | 12144.39 | 0.043 | ## | |
| -10 | 6315.262 | 0.014 | ## | |
| -20 | 4411.597 | 0.0097 | ## | |
| -30 | 3802.787 | 0.008 | ## | |
| -40 | 3580.163 | 0.0071 | ## | |

FIG. 2A is a graph 202 showing a measured dielectric permittivity ($\epsilon_r$) dependence on the temperature of a BST-based tuHDC block (x=0.6) over a temperature range of −40° to 40° C. at 10 KHz and 100 MHz operation frequency. The dielectric permittivity was maximized at the Curie temperature ($T_c$=0° C.) 204. In FIG. 2A, the BST-based tuHDC block is in the paraelectric state for the temperature being above the Curie temperature ($T_c \approx 0°$ C.). Dielectric permittivity at high frequency and low frequency reached a maximum at the Curie temperature. When the tuHDC block temperature ($T_b$) approached to the Curie temperature 204, $\epsilon_r$ reached a maximum (~16000), then dropped to ~4500 at the room temperature ($T_{room}$) and to ~2200 at ~40° C., exhibiting a very large tunable range. FIG. 2B is a graph 206 showing a measured dielectric loss (tan δ) of BST (x=0.6) ceramic block. The dielectric loss was maximized at the Curie temperature ($T_c \approx 0°$ C.). FIG. 2B represents the relationship between the dielectric loss (tan δ) of BST and material temperature over a temperature range −40 to 40° C. at 10 kHz and 100 MHz. The high-frequency measurement at 70-100 MHz was done in temperature between 10 to 30° C. The dielectric loss (tan δ) also reached a maximum at the Curie temperature and became much smaller at 10-30° C. (tan δ<0.03) in the paraelectric state which is ideal for MR imaging applications.

Figure 2C:
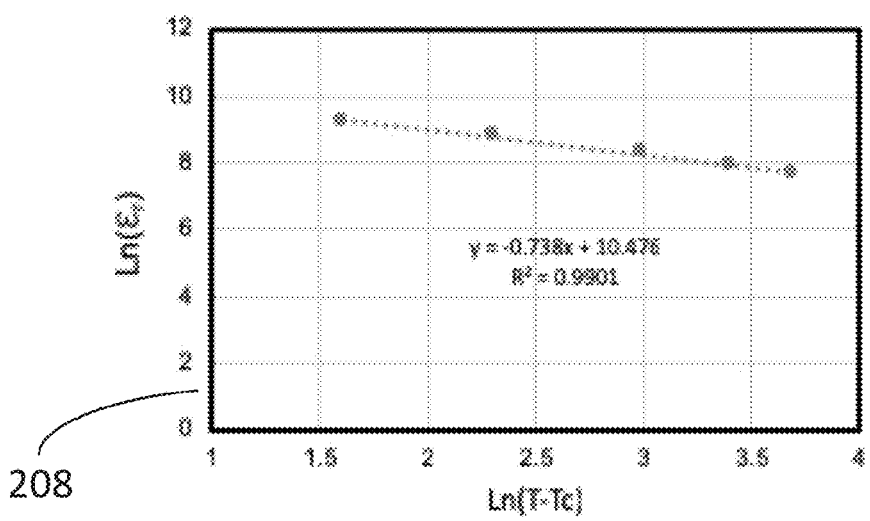

The relative permittivity ($\varepsilon_r$) of tuHDC ceramics (e.g., made by the BST material) in the paraelectric state is temperature dependent according to the Curie-Weiss Law:

$$\varepsilon_r = \frac{C}{T_b - T_c},\qquad \text{Eq. [5]}$$

where C is the Curie constant and $T_b$ is the tuHDC ceramic temperature (° C.). The $T_c$ value may be measured as shown in FIG. 2A or can be found in the literature for various uHDC material and composition. To determine C of BST, Ln($\varepsilon_r$) was plotted vs. Ln($T-T_c$) where the Curie constant can be calculated based on the intercept (shown in graph 208 in FIG. 2C as an example). Another approach is to determine the value C using the known $T_c$ and $\varepsilon_r$ values at the room temperature of T=20° C. according to Eq. [5]. For various examples described herein, C was determined to be approximately 90000 for the BST-based tuHDC ceramics based on the parameters of $T_c \approx 0$° C. and $\varepsilon_r \approx 4500$ measured at the room temperature of 20° C.

Figure 3:
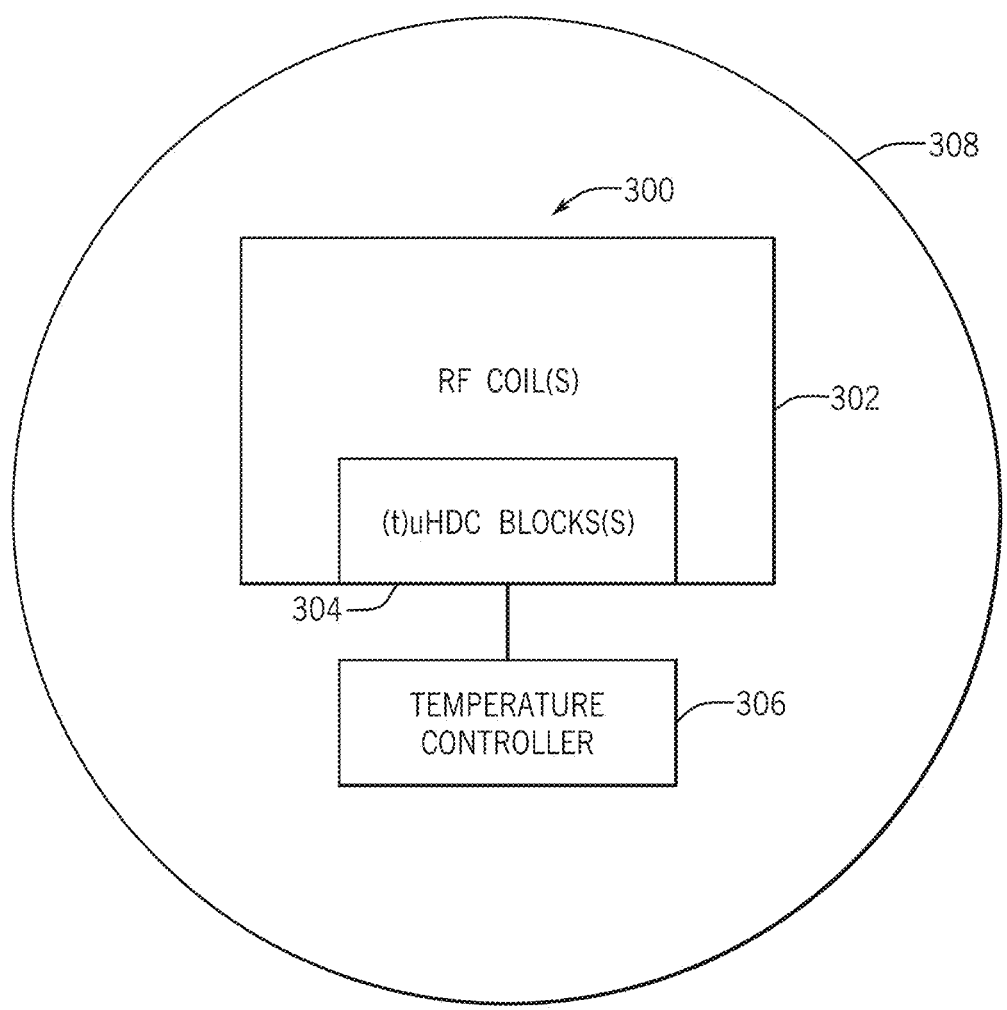
FIG. 3 is a schematic block diagram of an apparatus for transmitting and receiving radiofrequency (RF) signals including a at least one RF coil and tunable ultrahigh dielectric constant (tuHDC) material blocks located inside a MR imaging scanner in accordance with an embodiment.

FIG. 3 is a schematic block diagram of an apparatus for transmitting and receiving radiofrequency (RF) signals including at least one tunable ultrahigh dielectric constant material block(s) in accordance with an embodiment. The apparatus 300 includes at least one RF coil 302, at least one uHDC or tuHDC ((t)uHDC) block(s) (e.g., a pad(s)) 304 and a temperature controller 306. The apparatus 300 may be disposed inside an MRI scanner 308. In another embodiment, the apparatus 300 may not include a temperature controller as described further below. The RF coil (s) 302 may be, for example, a head coil array or other type of RF coil and may be configured for one or more types of MM or MRS(I) applications, for example, $^{31}$P MRS(I), $^{17}$O MRS(I) imaging,), $^{2}$H MRS(I), $^{23}$Na MRI/MRS(I), $^{1}$H MRI, etc. The (t)uHDC block(s) 304 may be positioned within the RF coil 302, on the RF coil 302, or adjacent to the RF coil 302. Each (t)uHDC block (or pad) 304 has a desired shape, such as, for example, circular, rectangular, flat and curved, etc. for conforming to the RF coil(s) and imaging subject. The at least one (t)uHDC block(s) (e.g., pad(s)) 304 are constructed of a low-loss and ultrahigh dielectric constant (uHDC) material. In one embodiment, the uHDC material is configured to be permittivity-tunable. The permittivity of the uHDC block 304 may be tuned by, for example, controlling or adjusting the material temperature within a safe temperature range. In an embodiment, the tuHDC materials or ceramic pads are made of composite barium strontium titanate (BST) compounds ($Ba_{0.6}Sr_{0.4}TiO_3$) that have low dielectric loss and very high permittivity tunability from 2,000 to 15000 by varying the ceramic temperature between 0° C. to 40° C. (as shown in FIGS. 2A and 2B). Temperature controller 306 is coupled to at least one (t)uHDC block 304 and is configured to control the material temperature of the (t)uHDC block to adjust and optimize permittivity for MR imaging applications. Temperature controller 306 may use known methods for controlling material temperature. In one embodiment, the temperature controller 306 uses water flow to control and maintain the desired temperature of the (t)uHDC block(s) 304. As discussed herein, by tuning the permittivity of the (t)uHDC block(s) that are incorporated in the RF coil 302 large and optimal denoising effect and signal-to-noise ratio (SNR) improvement can be achieved in detecting MR signals for imaging applications.

In another embodiment, a plurality of permittivity tunable uHDC blocks 304 may be provided in the RF coil 304 in an array. Each permittivity tunable uHDC block in the array may perform similar to a single RF coil to strengthen $B_1^+$ and $B_1^-$ fields for the (t)uHDC-RF coil apparatus 300, thus, to improve RF transmission efficiency and MR signal detection sensitivity. Accordingly, an array of (t)uHDC blocks 304 may be configured to behave similar to a volume coil to strengthen $B_1^+$ and $B_1^-$ fields and enlarge the imaging coverage volume for the (t)uHDC-RF coil apparatus 300, thus, to improve RF transmission efficiency and MR signal detection sensitivity. In an embodiment, a plurality of permittivity tunable uHDC blocks may be arranged in a helmet configuration to cover a subject's head. In another embodiment, the (t)uHDC-RF coil apparatus 300 may be used in a MRI or MRS(I) system configured for proton and/or X-nuclei imaging applications and the temperature controller may be configured to adjust the permittivity of the (t)uHDC block(s) 304 so as to optimize the performance of the RF coil 302 for imaging a specific nuclei at a desired operation frequency. Accordingly, the imaging configuration of the (t)uHDC-RF coil apparatus 300 may switch between different nuclides by adjusting the tuHDC material temperature, thus, permittivity to the two desired operation frequencies.

Figure 4A:
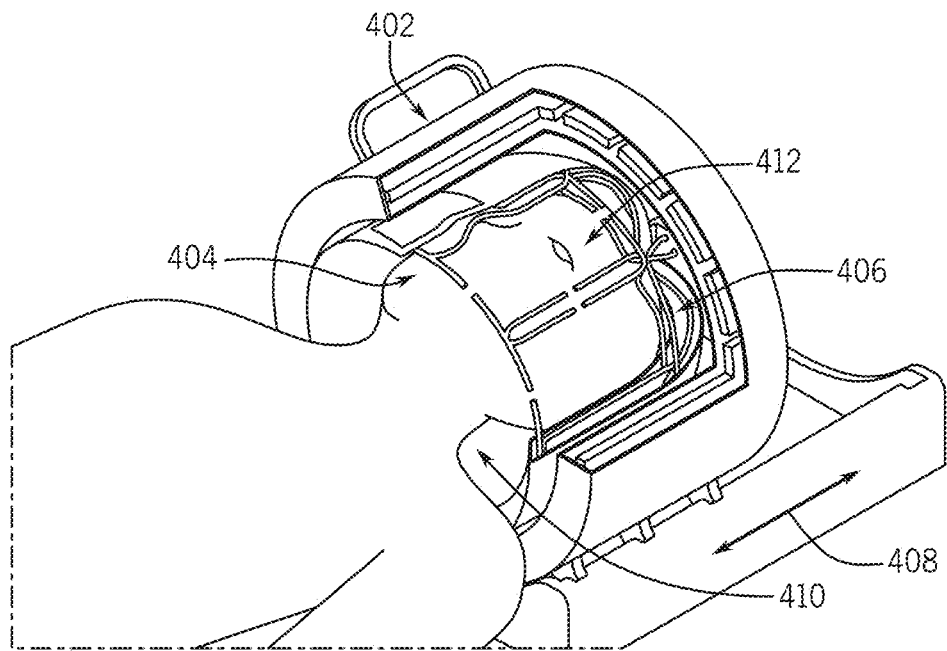
FIG. 4A is a diagram of an example of a tuHDC-RF human-head volume coil assembly consisting of one or multiple tuHDC pads and transmission and receive coil arrays for human brain MR imaging applications in accordance with an embodiment.

FIG. 4A is a diagram of an example of a tuHDC-RF-head volume coil assembly in accordance with an embodiment. In an embodiment, the tuHDC-RF-head volume coil assembly is configured for human brain X-nuclear MRSI applications at 7 T (e.g. $^{31}$P MRSI at 120 MHz), and $^{1}$H MRI at 3 T (128 MHz) or $^{17}$O MRSI at 10.5 T (60.6 MHz) etc. in accordance with an embodiment. Multiple blocks (or pads) or a dome- or helmet-shape tuHDC former 406 is incorporated with the head RF volume transmission coil (or array coils, $T_x$) 402. The receiver (Rx) coil 404 is a dome-shaped 8- or 16-channel phased array covering the head of subject 412. A Microstrip Transmission Line (MTL) or TEM volume coil may be used for X-nuclear transmit (Tx) 402 at a desired operation frequency, but has an option for $^{1}$H Tx/Rx operation based on dual-nuclide MTL or TEM coil design. The parameters ($\varepsilon_r$, thickness and shape) of the tuHDC- and RF-coil configurations may be optimized at a given field strength for a particular nuclide application of interest (e.g., $^{17}$O and $^{2}$H MRSI at 10.5 T, $^{31}$P and $^{23}$Na MRSI at 7 T, and $^{1}$H MRI at 1 T, 1.5 T, or 3 T). Similarly, the (t)uHDC-RF-Coil design without the MTL or TEM volume coil may be adapted to a 8- to 32-channel Tx/Rx transceiver coils using a relatively low and optimal $\varepsilon_r$ (<300) for human $^{1}$H MRI and $^{1}$H MRSI applications at ≥7 T.

Figure 4B:
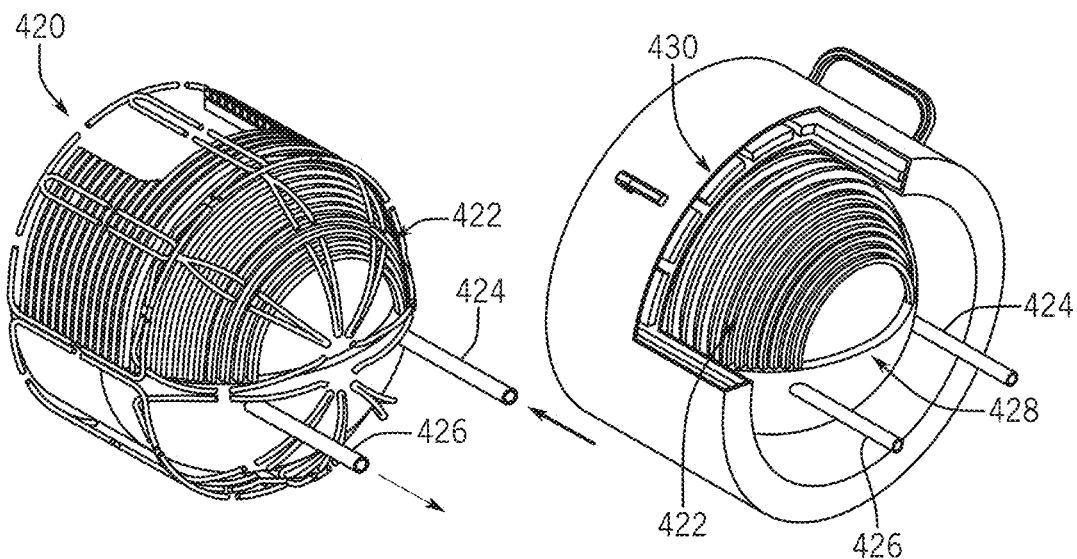
FIG. 4B is a diagram of an example of a dome-shape tuHDC-RF human-head volume coil configuration with a temperature control unit for tuning and optimizing tuHDC permittivity for MR imaging applications in accordance with an embodiment.

FIG. 4B is a diagram example of a dome-shape tuHDC-RF-head volume coil configuration and temperature control unit in accordance with an embodiment. Multiple tuHDC blocks (or pads) may be formed in a dome-shape or helmet-shape 422 and incorporated into a whole head RF volume coil (or array coils) 430. In FIG. 4B, a temperature control unit include a temperature exchange chamber 428 with circulating fluid (e.g., water or perfluoropolyether fluorinated liquid with excellent heat transfer properties without MR signal interference). The fluid may be circulated in and out of the temperature exchange chamber via tubes 424 and 426. In an embodiment, the tuHDC-RF-head volume coil may be used for broad MR imaging applications (e.g., $^{17}$O and $^{2}$H MRSI at 10.5 T, $^{31}$P and $^{23}$Na MRSI at 7 T, and $^{1}$H MRI at 1 T, 1.5 T or 3 T) in accordance with an embodiment. In an embodiment, such design may offer better performance and large imaging coverage of the entire human brain.

In an embodiment, the BST-based tuHDC ceramic materials or block(s) (e.g., (t)uHDC block(s) 304 shown in FIG. 3) and performance can be further improved by tailoring the BST material property via adjusting the chemical composition fraction x of $Ba_xSr_{1-x}TiO_3$. Increasing x from 0.6 towards 0.7 will shift the $T_b$-dependent permittivity curves towards a higher temperature as schematically illustrated in FIG. 1. This property provides a unique strategy for achieving an ultrahigh $\varepsilon_{r,optimal}$ for a particular MR imaging application of interest at a higher $T_b$, for instance, towards room temperature by optimizing the x value. The 7 T $^{23}$Na MRSI study using the BST-based tuHDC ceramics (x=0.6) as discussed above and below with respect to FIG. 14 herein proves a proof of concept. Further increase in the x value can substantially boost the tuHDC material permittivity to >6000 at room temperature, thus, potentially for optimal 1.5 T $^1$H MRI or 10.5 T $^{17}$O MRSI applications with an optimal $T_b$ at room temperature, thus, no temperature controller is needed for imaging. On the other hand, decreasing x can reduce the permittivity to 1000-2000 at room temperature, thus, for optimal $^{31}$P MRSI application at 7 T or $^1$H MRI application at 3 T as guided by FIG. 16 as discussed further below.

In yet another embodiment, the variation of tuHDC ceramic geometry or size might change the relationship between co and optimal $\varepsilon_r$ or $T_b$, nevertheless, the optimal condition for a particular tuHDC application at a desired operation frequency with an arbitrary size or geometry of interest can always be calibrated and optimized via the similar experimental procedure as demonstrated herein.

The following examples set forth, in detail, ways in which the present disclosure was evaluated and ways in which the present disclosure may be used or implemented, and will enable one of ordinary skill in the art to more readily understand the principles thereof. The following examples are presented by way of illustration and are not meant to be limiting in any way.

In various examples, (t)uHDC materials or blocks(s) were evaluated for material properties and temperature dependence and (t)uHDC materials or blocks(s) were evaluated for various MR imaging methods at varied magnetic field strength, specifically, (a) a uHDC block was evaluated for $^{31}$P MRS imaging studies of phantom and human brain at 7 T, (b) tuHDC blocks were evaluated for a $^{17}$O MRSI phantom study at 10.5 T, (c) tuHDC blocks were evaluated for a $^{23}$Na MRSI phantom study at 7 T, and (d) tuHDC blocks were evaluated for a $^1$H MRI phantom study on a clinical 1.5 T scanner. For some studies, $B_1$ mapping and quality factor (Q) measurement were performed.

The inorganic phosphate (Pi) signal was used to quantify $B_1$ maps for phantom and in vivo $^{31}$P MRSI experiments at 7 T, $^{17}$O natural abundance water signal was used to quantify $B_1$ maps for phantom $^{17}$O MRSI experiments, at 10.5 T, water proton signal was used to quantify $B_1$ maps for phantom $^1$H MRI experiments at 1.5 T, and $^{23}$Na signal of NaCl was used to quantify $B_1$ maps for phantom $^{23}$Na MRSI experiments at 7 T. The imaging voxel-based $B_1$ field maps may be regressed and determined using the following equations:

$$S \propto \rho \times B_1^- \times \sin(\alpha); \alpha = \gamma \cdot \tau \cdot B_1^+ \cdot V \qquad \text{Eq. [6]}$$

where S is the MRI/MRS(I) signal intensity detected under fully relaxed condition, $\alpha$ is the RF pulse flip angle, $\tau$ is the hard RF pulse width and V is the RF transmitter pulse voltage. The relative magnitude of RF coil transmission field $B_1^+$ is inversely proportional to V for reaching $\alpha = 90°$ ($V_{90°}$), and the relative magnitude of RF coil reception field $B_1^-$ is proportional to the maximum MRI/MRS(I) signal intensity reached at $\alpha=90°$ under fully relaxed acquisition condition ($S_{90°}$). For partially relaxed acquisition condition, the correction of the saturation effect should be considered. Eq. [6] was employed to calculate and generate the $B_1^+$ and $B_1^-$ maps (in the transverse imaging orientation) based on a series of 3D chemical shift imaging (CSI) or multiple-slice MM data sets acquired with multiple RF pulse transmitter power voltages. $B_1$ (i.e., $B_1^=$ and $B_1^-$) maps were estimated using a nonlinear curve fitting algorithm.

One method that may be used to measure the quality factor (Q) and change is to measure the RF coil resonant peak by performing an $S_{11}$ measurement with a network analyzer. Another method that may be used to measure the quality factor (Q) is to measure the self-resonance frequency of the tuHDC block using two overlapping pick-up coils and performing an $S_{21}$ measurement. The Q value may be calculated according to:

$$Q \approx \frac{\omega}{\Delta \omega} \qquad \text{Eq. [7]}$$

where $\Delta\omega$ is the resonance frequency difference measured at 3 dB point from the resonance peak.

Example 1

Figure 5A:
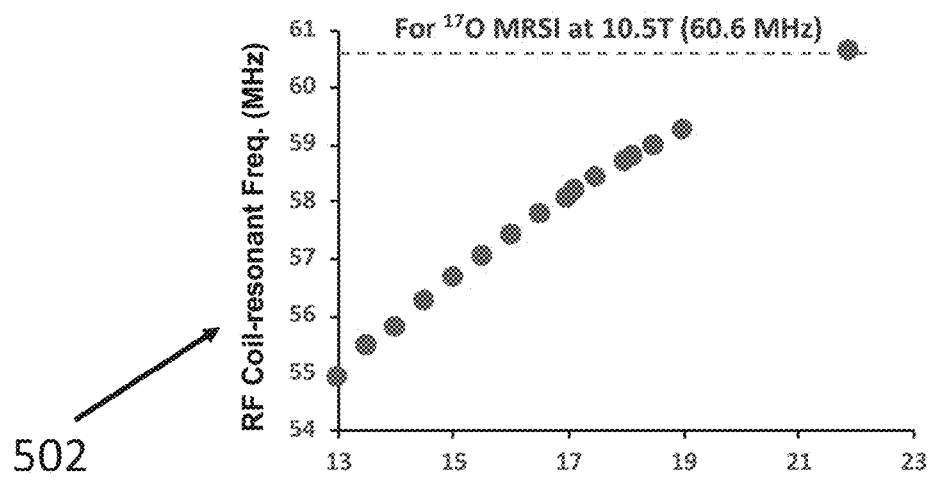
FIG. 5A is a graph showing s relationship between the RF coil resonant frequency (ω) shift and the BST-based tuHDC (x=0.6) ceramic block temperature based on the reference co of 60.6 MHz for $^{17}O$ MRSI application at 10.5 T, as an example, at room temperature of 20° C. in accordance with an embodiment.
Figure 5B:
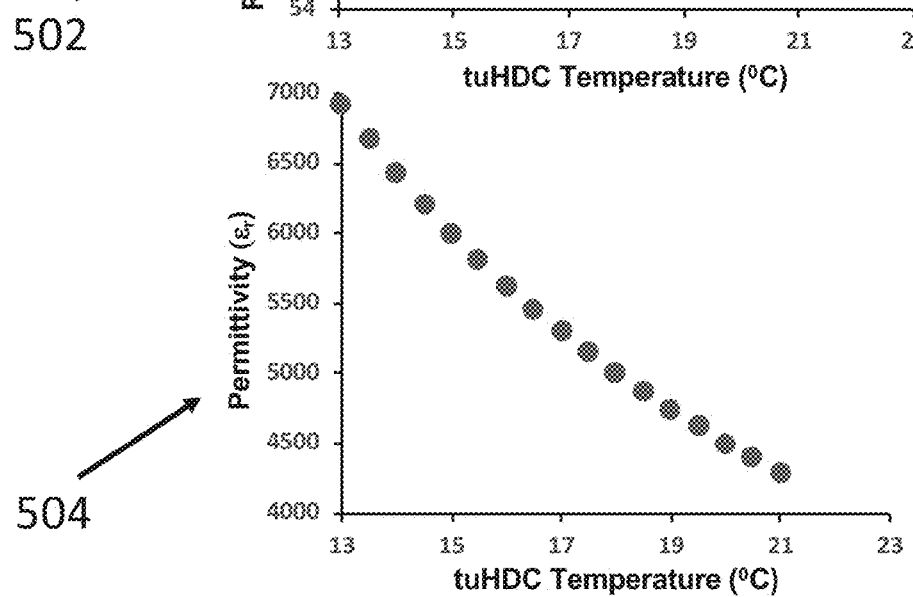
FIG. 5B is a graph illustrating an estimated relation between the BST-based tuHDC (x=0.6) ceramic block temperature and permittivity value based on the parameters of $T_c$≈0° C. and $\varepsilon_r$≈4500-4700 at the room temperature of 20° C. in accordance with an embodiment.
Figure 5C:
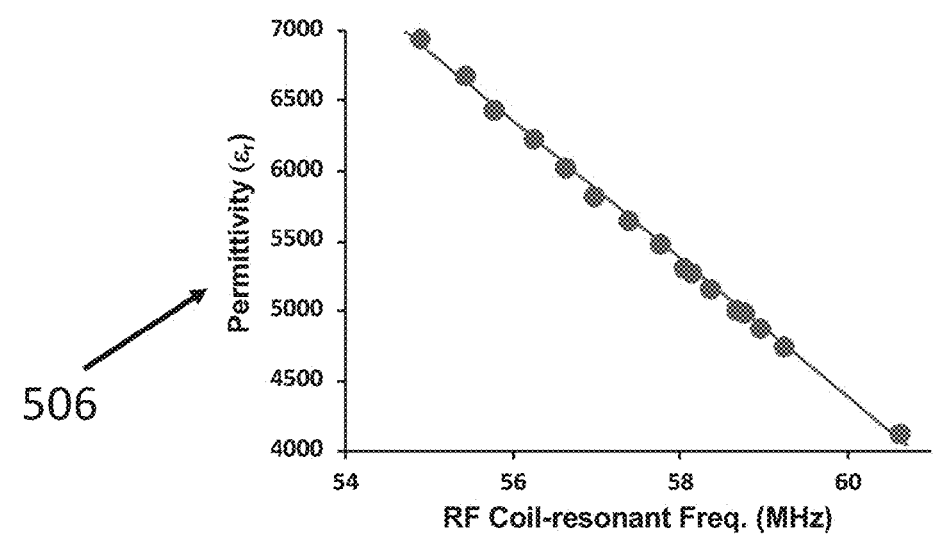
FIG. 5C is a graph illustrating a linear relation between the tuHDC permittivity ($\varepsilon_r$) and the RF coil resonant frequency (w) shift in accordance with an embodiment.
Figure 10:
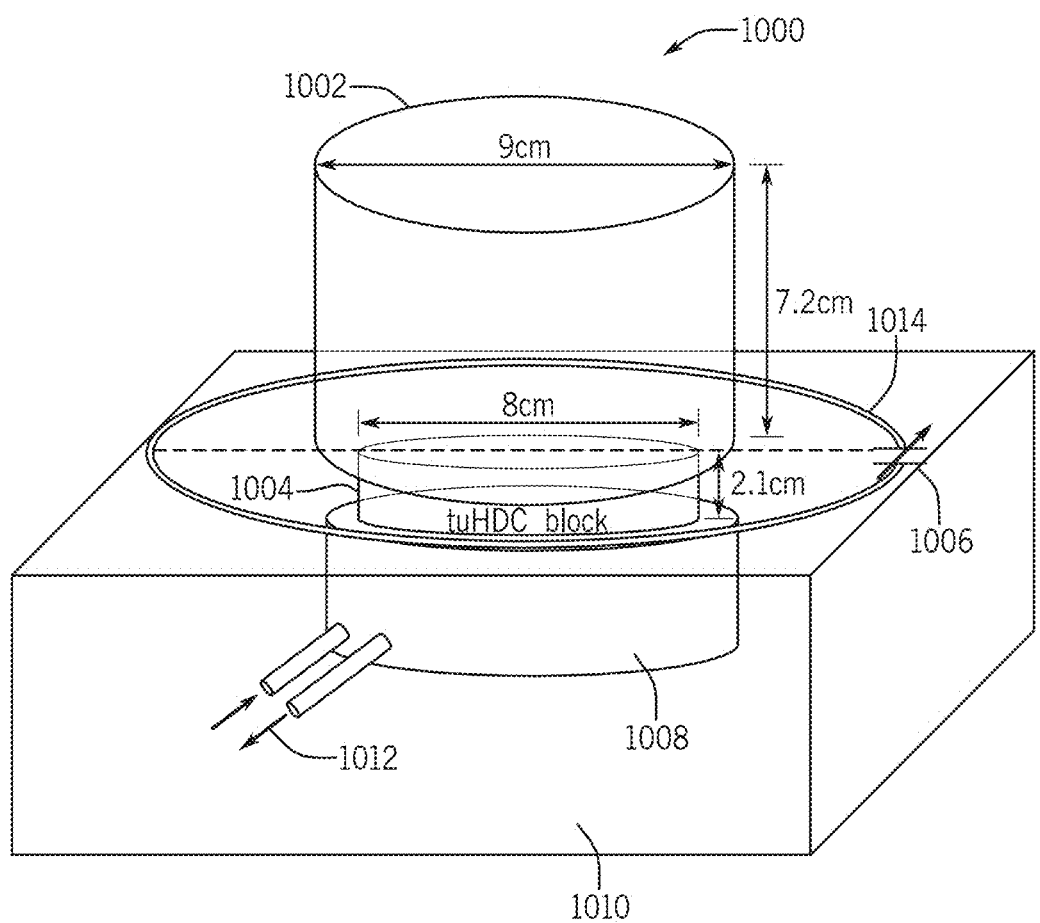
FIG. 10 is a schematic block diagram of an apparatus for tuning uHDC (tuHDC) materials incorporated with an RF coil and for testing and evaluating the performance of the BST-based tuHDC (x=0.6) ceramic method for MR imaging applications and generating the results shown FIGS. 12-15 in accordance with an embodiment.

As mentioned, studies were performed to evaluate tuHDC materials or blocks(s) for understanding material properties and temperature dependence. In this study, a BST-based tuHDC ceramic ($Ba_{0.6}Sr_{0.4}TiO_3$; x=0.6) block (e.g., a circular shape; 8 cm diameter and 2.1 cm thickness, e.g., block 1004 as shown in FIG. 10) was evaluated with a $^{17}$O RF surface coil (e.g., coil 1014 shown in FIG. 10). When placing the BST-based tuHDC ceramic at a center of the $^{17}$O RF surface coil, the interaction between them shifts the $^{17}$O RF coil resonant frequency ((p). FIG. 5A is a graph 502 that shows the relationship between the BST-based tuHDC block temperature and the shifting of the $^{17}$O RF coil resonance frequency from the reference operation frequency at 10.5 T of 60.6 MHz as set at room temperature. The RF coil resonant frequency was first tuned and matched to the $^{17}$O MRSI operation frequency (60.6 MHz) at the room temperature (20° C.), and was not re-tuned and re-matched when lowering the tuHDC block temperature ($T_b$). The RF coil frequency (1) shifted towards a lower frequency when $T_b$ decreased. FIG. 5B is a graph 504 illustrating an approximately inverse relationship between the temperature, $T_b$ (13 to 21° C.), and the tunable permittivity ($\varepsilon_r$) of the BST-based tuHDC block according to Eq. [5] based on the Curie temperature ($T_c \approx 0°$ C.) and Curie constant (C≈90000) derived from the $\varepsilon_r$ value of tuHDC block measured at 20° C. room temperature). The results clearly show very large tunability of the BST-based tuHDC block from 4500 at room temperature to 7000 at 13° C. From FIGS. 5A and 5B, a linear relationship between $\omega$ and $\varepsilon_r$ for the $T_b$ range of 13-21° C. was derived as shown by the graph 506 in FIG. 5C. The regression slope indicates that the $^{17}$O RF coil frequency increase of 1 MHz corresponds to a decrease in $\varepsilon_r$ of 504 for the BST-based tuHDC ceramics. This result reveals that the RF coil frequency shifting could provide an accurate and sensitive measure of the tuHDC permittivity and temperature dependent change with the same measurement setup. Therefore, the $\varepsilon_r$ value or temperature dependent change can be empirically determined from $T_b$ or $\omega$ shift.

Figure 6A:
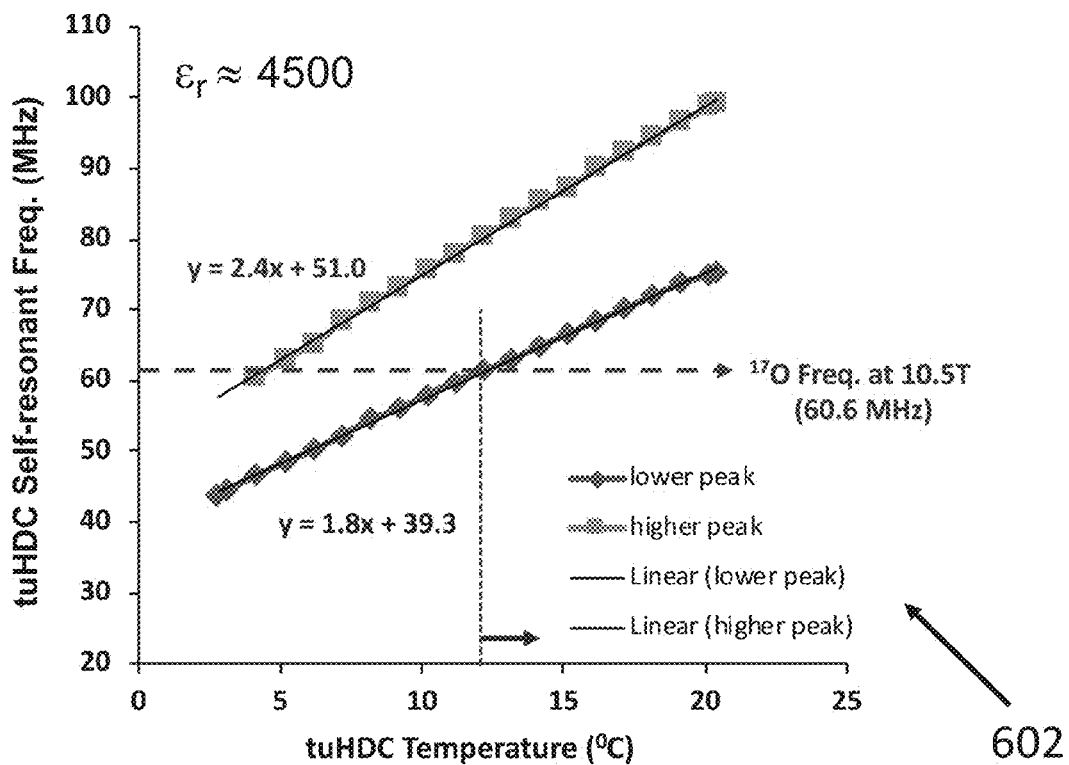
FIGS. 6A-6B illustrate example results showing the relation of the BST-based tuHDC (x=0.6) ceramic block self-resonant frequency and its shift as the function of the tuHDC block temperature for two prototype BST ceramic blocks with (A) $\varepsilon_r$≈4500 and (B) $\varepsilon_r$≈4700 at the room temperature of 20° C., respectively, in accordance with an embodiment.
Figure 6B:
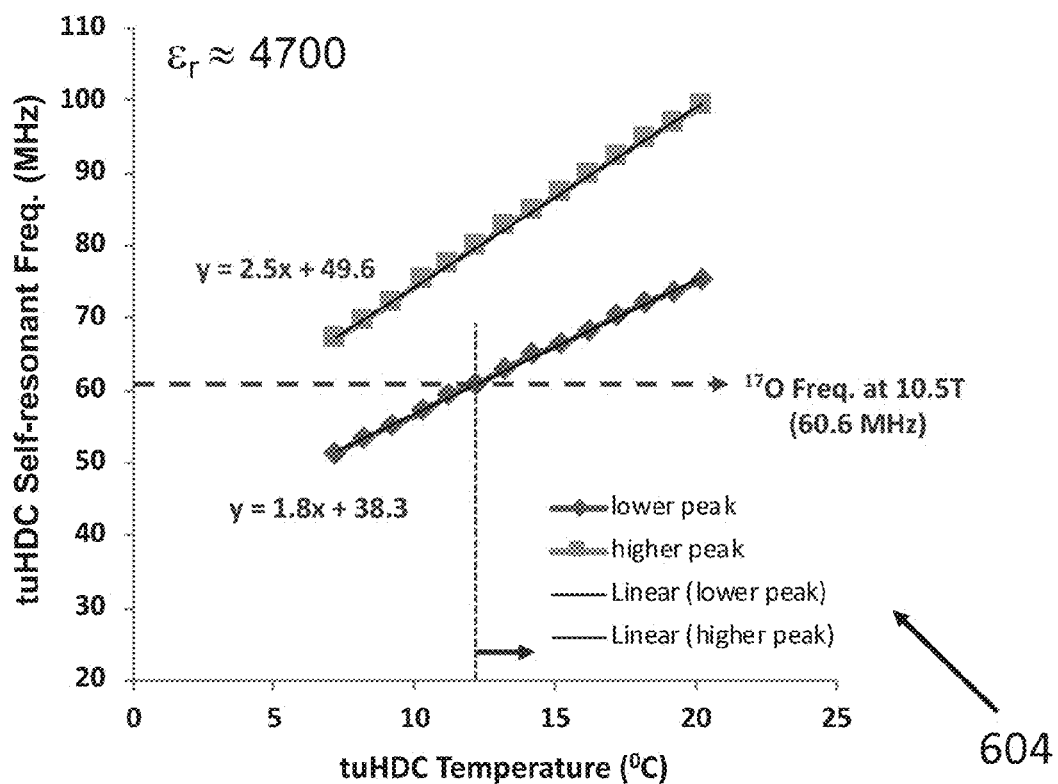

The BST-based tuHDC ceramics had two self-resonance modes and their resonant frequencies were temperature dependent. FIGS. 6A and 6B are graphs 602 and 604 showing the characteristic of the BST-based tuHDC self-resonance modes with varied self-resonant frequency up to 110 MHz as the function of tuHDC block temperature measured in two BST blocks. In this example, the resonant modes were measured with a pickup probe using a network analyzer. There were two self-resonance modes with the self-resonant frequency of at least 10 MHz higher than the $^{17}$O operation frequency at 10.5 T (60.6 MHz) at room temperature of 20° C. However, both self-resonant frequencies declined towards a lower tuHDC block temperature, although slightly different declining slopes were observed. The self-resonant frequency may cross the $^{17}$O operation frequency of 60.6 MHz at 11.8° C. for the low self-resonant frequency mode and at 4° C. for the high self-resonant frequency mode which can lead to passive coupling between the $^{17}$O RF coil resonance and the tuHDC self-resonance. To avoid this passive coupling, the $^{17}$O imaging studies at 10.5 T were performed at the tuHDC block temperatures of 12° C. in this study.

Figure 7A:
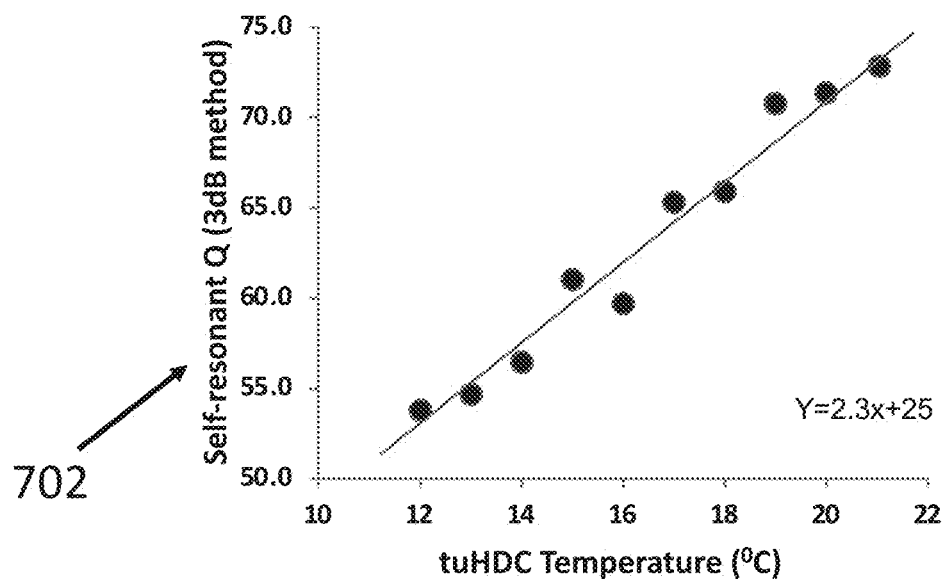
FIGS. 7A-7B illustrate example results showing the relation between (A) the low-frequency self-resonance quality Q of the BST-based tuHDC (x=0.6) ceramic block ($\varepsilon_r$≈4700) and the block temperature, and (B) the $^{17}O$ RF resonance coil quality Q and the tuHDC ceramic block temperature when the RF coil was incorporated with the tuHDC ceramic block in accordance with an embodiment.
Figure 7B:
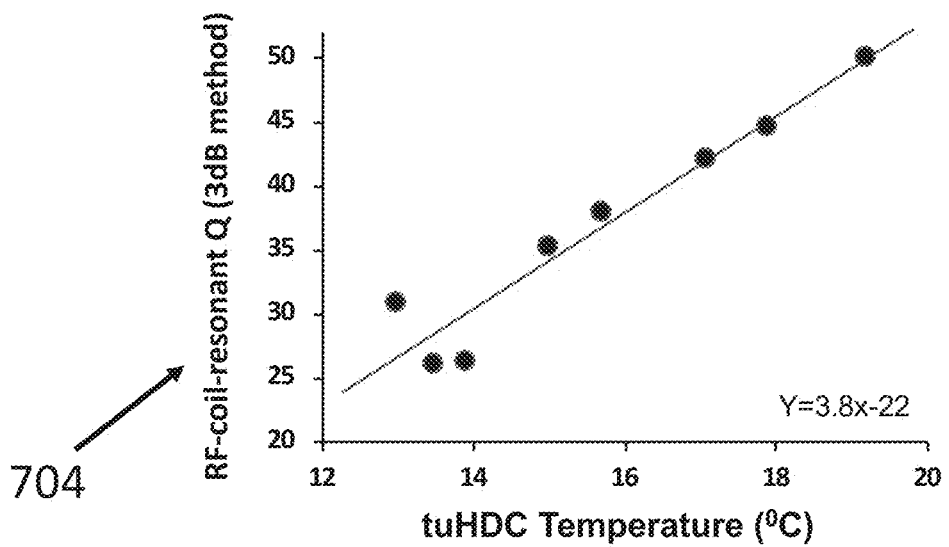

FIG. 7A is a graph 702 showing the relationship between the BST-based tuHDC self-resonance Q (low-frequency mode) and the tuHDC block temperature ($T_b$). FIG. 7A indicates a positive linear correlation between the low frequency self-resonance quality factor (Q) and $T_b$ for the temperature range of 12-21° C. FIG. 7B is a graph 704 that shows the $^{17}$O RF coil Q measured in the presence of the tuHDC block at different block temperature having a similar trend as the tuHDC self-resonance Q. This result suggests a strong interaction between the RF coil(s) and tuHDC block (s) for MR imaging applications.

Example 2

In another example, studies were performed to evaluate uHDC blocks for $^{31}$P MRS imaging studies of a phantom and human brain at 7 T. In one study, a rectangular and high dielectric loss uHDC block (see the graph 804 in FIG. 8A) was made of ferroelectric material of lead zirconate titanate (PZT: Pb(Zr, Ti)O$_3$) ceramics, which has an ultrahigh dielectric constant value ($\varepsilon_r \approx 1000$) suitable for the Larmor frequency of $^{31}$P MRS(I) (120 MHz) operated at 7 T. The loss tangent value, tan δ, of this PZT-based uHDC block was high in the operation frequency range of 120-125 MHz. In another study, a curved uHDC block (13 cm width, 21.4 cm arc length, 2.3 cm thickness) was made of PZT (PBS (Zr$_{0.5}$Ti$_{0.5}$)TiO$_3$) with a low tan δ value (≈0.05) and very high permittivity ($\varepsilon_r \approx 1200$ and insensitive to temperature change). The curved uHDC block was used to test $^{31}$P MRSI (120 MHz) at 7.0 T for phantom and human brain studies. The permittivity values of the rectangular and curved PZT-based uHDC blocks were fixed and not temperature sensitive, thus non-tunable.

The $^{31}$P MRS studies were carried out on a 7 T whole-body/90-cm bore human scanner using a $^{31}$P-$^{1}$H dual-nuclei transverse electromagnetic (TEM) volume coil (inner diameter=28 cm, coil length=10 cm) consisting of eight RF coil elements (or rungs) at the $^{1}$H operation frequency (297 MHz) and another eight RF coil elements at the $^{31}$P operation frequency (120 MHz) driven by a quadrature RF power mode. Both the $^{31}$P and the $^{1}$H coil elements in the TEM volume coil were tuned and matched in the presence and absence of the uHDC block. The $^{31}$P MRS imaging (MRSI) tests were based on three-dimensional (3D) chemical shift imaging (CSI) using the Fourier Series Window (FSW) technique. The experimental protocol consisted of paired acquisition in the presence or absence of the uHDC ceramic, and care was taken to place the object in the same position within the TEM volume coil for the two comparative acquisitions.

A spherical phantom (15 cm diameter) was used for the 7 T $^{31}$P MRSI phantom study, which was filled with inorganic phosphate (Pi: 50 mM), sodium chloride (50 mM), and gadolinium contrast agent (0.05 mM: for shortening the longitudinal relaxation time (T$_1$) of Pi to ~300 ms) at 7 T. The curved low-loss PZT-based uHDC block was positioned at the bottom of the phantom inside the $^{31}$P-$^{1}$H TEM head coil as described further below with respect to FIGS. 9A and 9B. Multiple 3D $^{31}$P CSI data sets were acquired under fully relaxed conditions with the following parameters: repetition time (TR)=2 s, RF (hard) pulse width=1 ms, 3D phase-encoding matrix=9×9×7, spectral bandwidth=5 kHz, field of view (FOV)=40×40×36 cm$^3$, number of complex data points of FIDD=1024, varied RF pulse flip angles by adjusting RF pulse voltage (V), number of signal average=1.

The 3D $^{31}$P CSI data were acquired in human brain under partially saturated condition with variable RF pulse voltages including an Ernst flip angle (α=42°) for the phosphocreatine (PCr) resonance (TR=1.0 s, 3D matrix size=9×9×7, spectral bandwidth=5 kHz, FOV=20×20×18 cm$^3$, number of complex data points=800, RF hard pulse width=1 ms, two signal averages). The nominal voxel size of 3D $^{31}$P CSI was 12.7 ml, and total acquisition time was 10.7 minutes for collecting each CSI data set.

Post-processing of the $^{31}$P MR spectra included the temporal zero-filling of FIDs to 2048 data points without line broadening. Spectrum analysis was performed sing a Lorentzian-curve fitting with AMARES fitting algorithms and the spectral noise level was calculated using a standard deviation (SD) of spectral baseline, i.e., the chemical shift regions without the presence of the $^{31}$P signals.

Figure 8A:
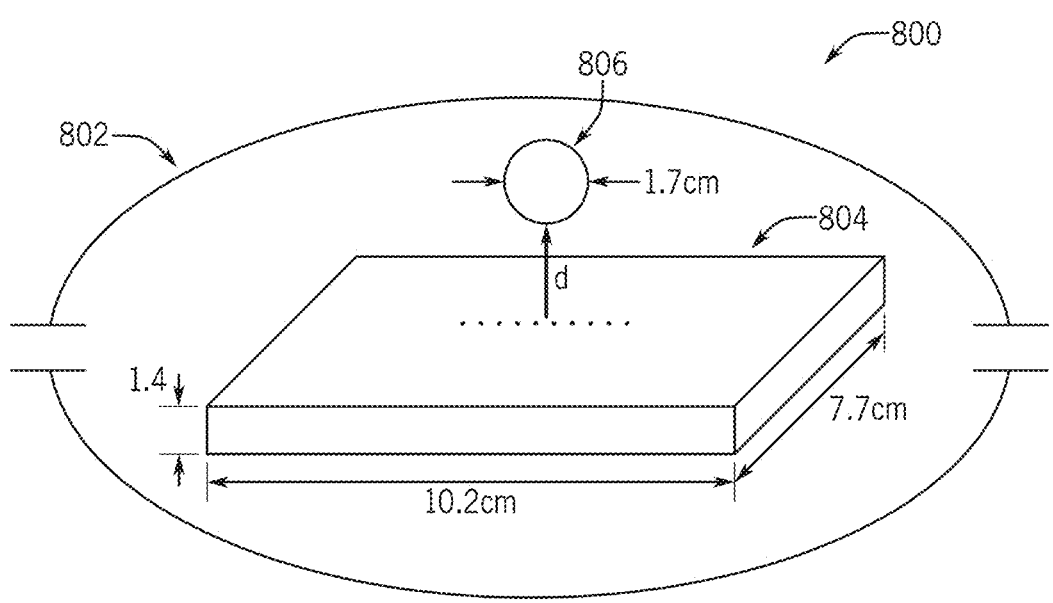
FIG. 8A shows an example apparatus for a $^{31}P$ MRS phantom study at 7 T using a high dielectric loss uHDC block made of PZT in accordance with an embodiment.
Figure 8B:
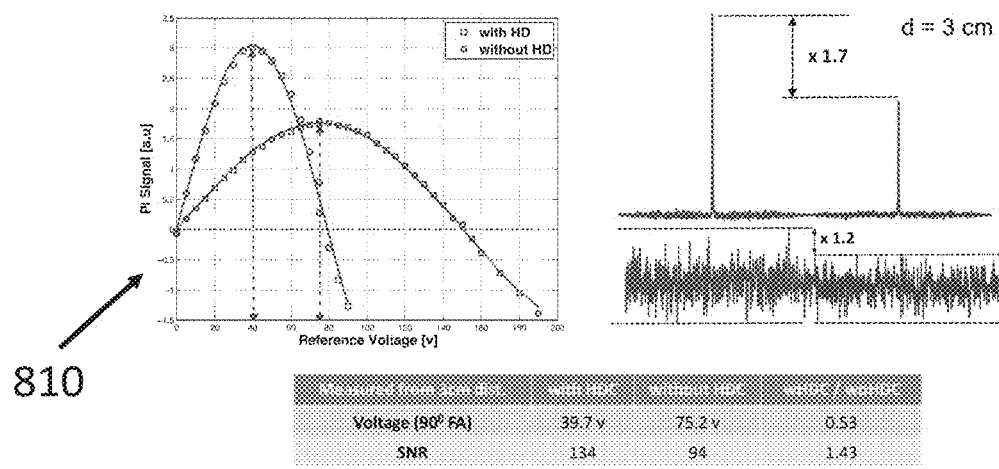
FIGS. 8B and 8C illustrate a comparison of $B_1^+$ and $B_1^-$ regression, $^{31}P$ signal and noise results obtained with and without the use of the high-loss PZT block at a varied distance (d) between the spherical phantom and the PZT block, indicating improved $B_1^+$ and $B_1^-$ regression, but also significantly increased noise level using the PZT block in accordance with an embodiment.
Figure 8C:
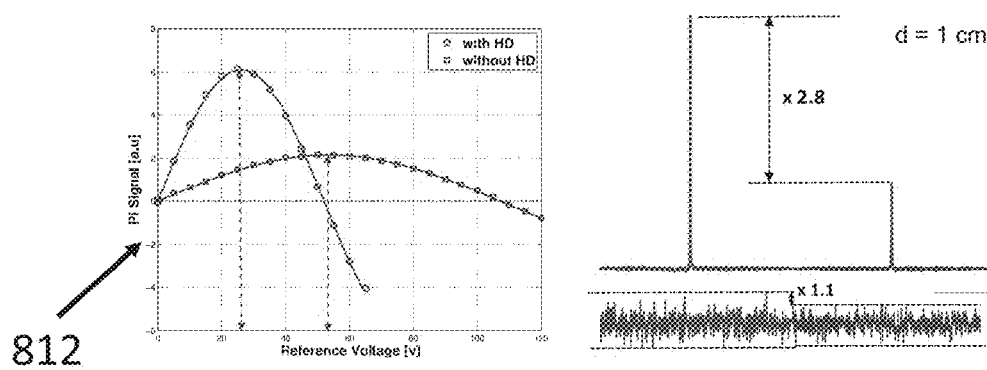

FIGS. 8A-8C demonstrates one example of a $^{31}$P MRS phantom study at 7 T using the rectangular uHDC block made of PZT but with a high tan δ value. As shown in FIG. 8, in this example the $^{31}$P MRS test was conducted using a small (1.7 cm diameter) spherical P$_i$ phantom 806 and a $^{31}$P surface RF coil 802 (15.6 cm diameter) in the presence or absence of a high dielectric loss, rectangular-shape uHDC block 804 made of PZT material. The $^{31}$P MR spectra were obtained with varied RF pulse voltage. Although both B$_1^+$ and B$_1^-$ were significantly increased at 3 cm (graph 810 in FIG. 8B) or 1 cm (graphs 812 in FIG. 8C) distance of the sample from the PZT-based block, the noise level was largely increased as compared to the control with no the PZT-based block, thus, significantly reduced the degree of SNR gain. It is clear that a low tan δ is a key factor for achieving an optimal denoising effect offered by the (t)uHDC technology for MR imaging applications.

Figure 9C:
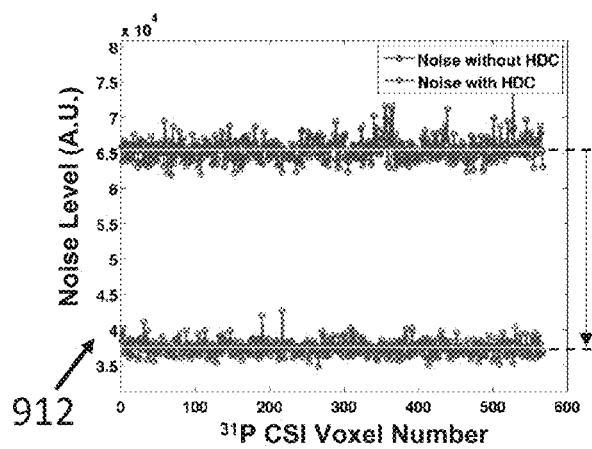
FIGS. 9C-9D illustrate results of a study using the apparatus of FIGS. 9A and 9B and include a) uniform denoising effect across all 3D $^{31}P$ MRSI voxels (>550) covering the entire imaging field of view (FOV) under (C) loaded (43% noise reduction) and (D) unloaded (20% noise reduction) conditions, respectively, at 7 T in accordance with an embodiment.
Figure 9D:
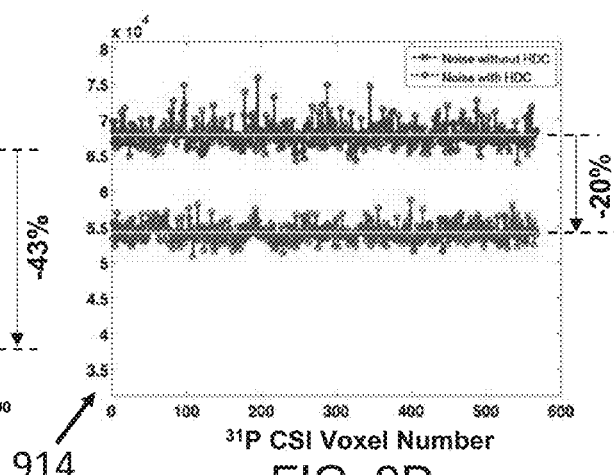
Figure 9E:
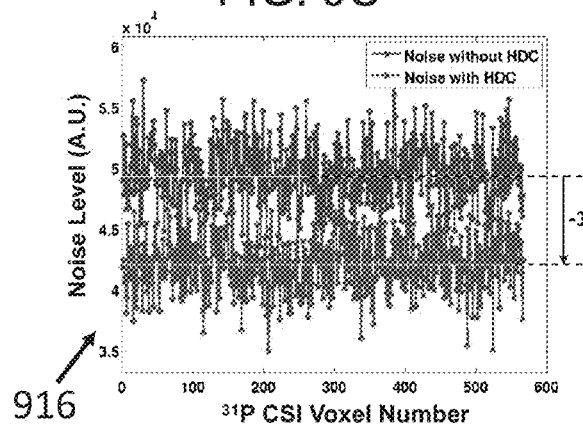
FIG. 9E illustrates example results of 3D $^{31}P$ MRSI denoising effect using low-loss curved uHDC pad in human brain imaging application at 7 T and includes uniform denoising effect across all 3D $^{31}P$ MRSI voxels (>550) covering the entire FOV showing approximately 16% noise reduction in the human brain in accordance with an embodiment.

The low-loss non-tunable uHDC block achieved a large denoising effect and increased SNR for $^{31}$P MRSI of a phantom and human brain at 7 T. FIGS. 9A-9D shows that the integration of the low-loss uHDC curved block made of PZT (PBS(Zr$_{0.5}$Ti$_{0.5}$)TiO$_3$) material with the TEM head volume coil resulted in a large denoising effect observed in all 3D $^{31}$P MRSI voxels in either the presence or absence of the $^{31}$P phantom. FIG. 9A shows the experimental setup 902 for this example study and includes a $^{1}$H-$^{31}$P RF TEM volume coil 906. A spherical phantom 904 is positioned inside the TEM volume coil 906 (under loaded condition). A curved uHDC block 908 was positioned at the bottom of the spherical phantom 904. FIG. 9B shows an example experimental setup without the $^{31}$P phantom (i.e., under unloaded condition). In this study, a large imaging field of view (FOV) was intentionally set to cover not only the phantom 904, but also outside the RF TEM head volume coil 906. FIG. 9C is a graph 912 showing a 43% noise reduction with the curved uHDC block compared to without using the block for the loaded condition. FIG. 9D is a graph 914 showing ~20% noise reduction for the unloaded condition. The loaded condition created a larger denoising effect (FIGS. 9A, 9C compared to the unloaded condition (FIGS. 9B, 9D). FIG. 9E is a graph 916 showing 16% noise reduction for human brain application. Interestingly, the denoising effect was observed globally across all CSI voxels as shown in FIGS. 9C-9E, therefore, is spatially independent. These findings collectively suggest: i) the application of the low-loss uHDC block could significantly interact and influence the RF coil performance and lead to a significant and global denoising effect; and ii) the loading of the phantom or object may further enhance the interaction among the RF coil, object, and uHDC block, resulting in a larger denoising effect. Overall, the application of the curved low-loss uHDC ceramic improved the $^{31}$P MRSI SNR for >100% and reduced the required RF pulse power for >85% for human brain application at 7 T.

Example 3

In this example, studies were performed to evaluate the BST-based tuHDC blocks for a $^{17}$O MRSI water phantom study at 10.5 T. Two circular tuHDC blocks (8 cm diameter, 2.1 cm thickness) was made using the BST-based ceramics (Ba$_{0.6}$Sr$_{0.4}$TiO$_3$) with a very low loss tangent (tan δ<0.03 for 10-30° C.), which depends on ω, T$_b$, and ε$_r$ according to Eq. [4]. The permittivity values of the two ceramics were ε$_r$≈4500 and 4700, respectively, at room temperature (20° C.). Within the temperature range of interest, i.e., above the Curies temperature (T$_c$≈0° C.) and below 40° C., the tuHDC ceramic is in the paraelectric state with ε$_r$≥2000 at T$_b$≈40° C. and ε$_r$>15000 near the Curie temperature. The BST-based tuHDC ceramic has a large tunable range in permittivity, which is highly sensitive to the BST material temperature according to Eq. [5] (also see graph 202 in FIG. 2A). The BST-based tuHDC ceramics were employed for conducting a $^{17}$O MRSI study at 10.5 T because a substantially higher permittivity value is are required owing to a relatively low operation frequency (60.6 MHz at 10.5 T).

The $^{17}$O MRSI experiments were carried out on a 10.5 T whole-body/88-cm bore human scanner with a single-loop $^{17}$O RF coil (15 cm diameter) operated at 60.6 MHz. FIG. 10 is a schematic illustration of an apparatus 1000 used to test the BST-based low-loss tuHDC blocks for denoising 3D $^{17}$O MRSI and improving RF transmission and reception efficiency and SNR at 10.5 T. A cylindrical shaped bottle 1002 filled with saline water (77 mM NaCl) was used as a test phantom. For the tuHDC studies, a circular BST-based tuHDC block 1004 was located at the RF coil 1014 center underneath the water phantom 1002 and surrounded by a temperature controller 1008. In one example, the temperature controller 1008 may use cold or warm water flow to control and maintain the desired BST-based tuHDC block 1004 temperature using a temperature control system 1008 and thermal insulation 1110. The same setup can be used for $^{23}$Na MRSI at 7 T (discussed below in Example 4) where RF coil operation frequency, optimal tuHDC material temperature and permittivity are different.

The tuHDC block 1004 and the temperature controller 1008 were thermally insulated using thermal insulation 1010, e.g., Styrofoam, as shown in FIG. 10. Multiple 3D $^{17}$O CSI data sets with variable RF pulse voltage were acquired under fully relaxed conditions with the following parameters: repetition time (TR)=0.2 s, RF (hard) pulse width=2 ms, 3D matrix size=9×9×7, spectral bandwidth=30 kHz, FOV=10×10×10 cm$^3$, number of complex data points of FID=1024, various pulse flip angles by adjusting RF transmitter power voltage, and no signal averaging. The SNR was calculated from the ratio between the spectral signals, i.e., the $^{17}$O water signal intensity in different MRSI voxels, and the corresponding spectral noise level determined from the standard deviation (SD) of the spectral baseline regions without any $^{17}$O resonance signal.

Figures 11A, 11B:
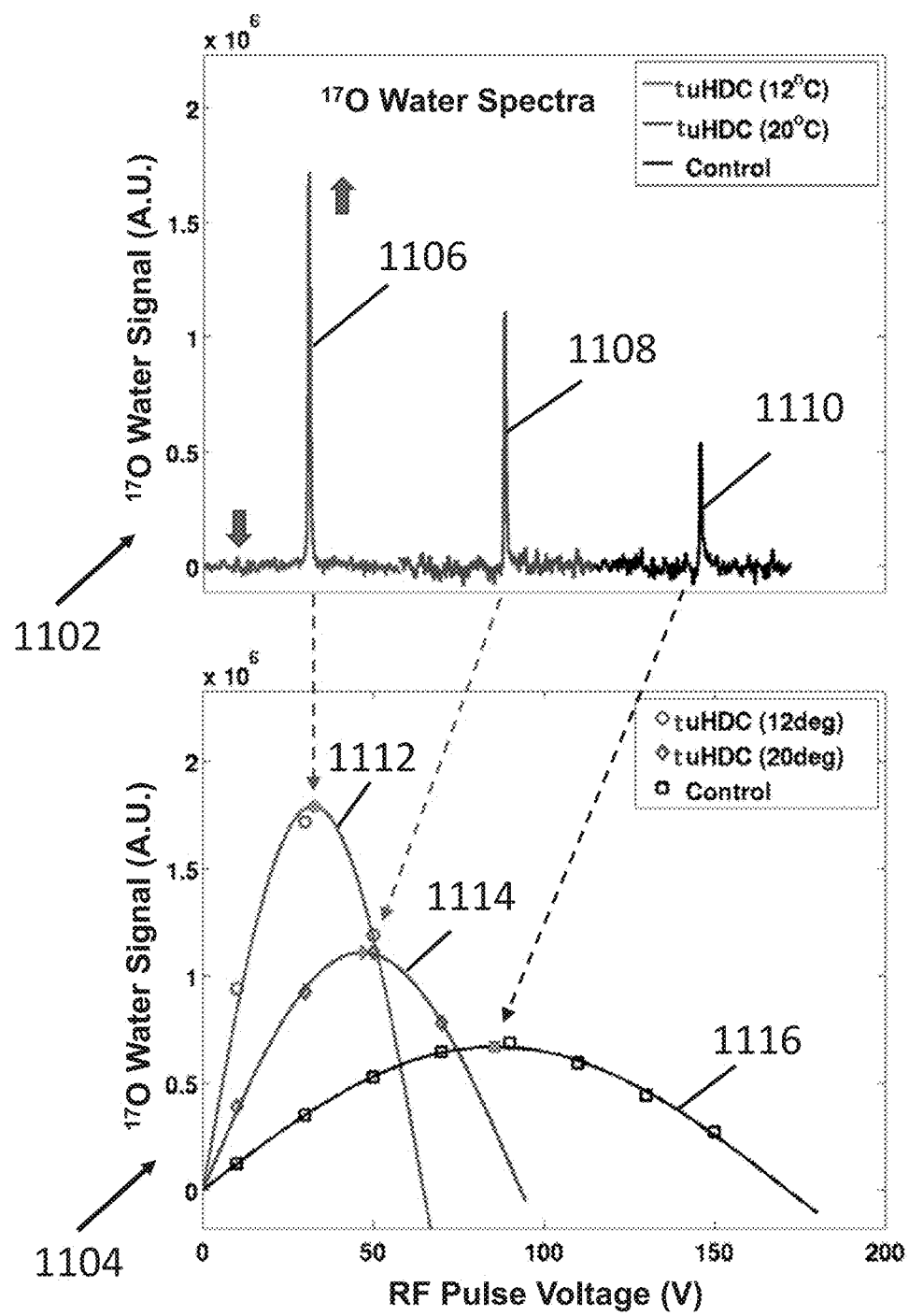
FIGS. 11A-11B are graphs illustrating (A) the $^{17}$O MR spectra of nature abundance $^{17}$O-water signal in a water phantom solution where the signal is taken from a central 3D $^{17}$O MRSI voxel acquired at 10.5 T with an optimal RF pulse voltage (V) for reaching the maximum water $^{17}$O signal at a 90° RF pulse flip angle, which were determined (B) via regression of the $^{17}$O signal intensity versus the RF pulse voltage under three conditions: without the BST-based tuHDC at room temperature (20° C.) as the control, with the tuHDC block at 20° C. and at 12° C., respectively, in accordance with an embodiment.

The low-loss BST-based tuHDC ceramics improve B$_1$ fields and reduce noise for $^{17}$O MRSI at 10.5 T. To evaluate the BST-based tuHDC ceramic performance, a $^{17}$O MRSI study was performed using a water phantom 1002 (shown in FIG. 10) and a $^{17}$O RF surface coil 1014 (shown in FIG. 10) on a 10.5 T human scanner. FIG. 11A shows a graph 1102 of representative $^{17}$O spectra of nature abundance $^{17}$O-water signal of the phantom taken from a central voxel of the three-dimensional (3D)$^{17}$O MRSI acquired at 10.5 T for reaching the maximum $^{17}$O-water signal at and α=90°, which was determined via regression of the $^{17}$O signal intensity versus the RF pulse voltage according to Eq. [6] (see graph 1104 in FIG. 11B), under three conditions: i) control condition without the tuHDC at the room temperature (20° C.) shown by curve 1106 in FIG. 11A and curve 112 in FIG. 11B, ii) with the tuHDC block at 20° C. shown by curve 1108 in FIG. 11A and curve 1114 in FIG. 11B, and iii) with the tuHDC block at 12° C. shown by curve 1110 in FIG. 11A and curve 1116 in FIG. 11B. First, the RF pulse voltage to reach α=90° (i.e., V$_{90°}$) was significantly reduced with the use of tuHDC, especially at 12° C. (V$_{90°}$ reduced >50%, thus, >4 times reduction in the required RF power), indicating a large enhancement of B$_1^+$ which is inversely proportional to V$_{90°}$, thus, largely improved RF transmission efficiency. Secondly, the maximum water $^{17}$O signal at α=90° (i.e., S$_{90°}$) was significantly increased using the BST-based tuHDC block at a col block temperature of around 12° C., indicating a significantly improved B$_1^-$ field, thus SNR (∝B$_1^-$). Third, the application of the BST-based tuHDC block generated a large denoising effect which was temperature dependent and the maximum denoising effect was achieved approximately at 12° C. in this phantom study (see graphs 1102 and 1104 in FIGS. 11A and 11B, respectively).

Figure 12A:
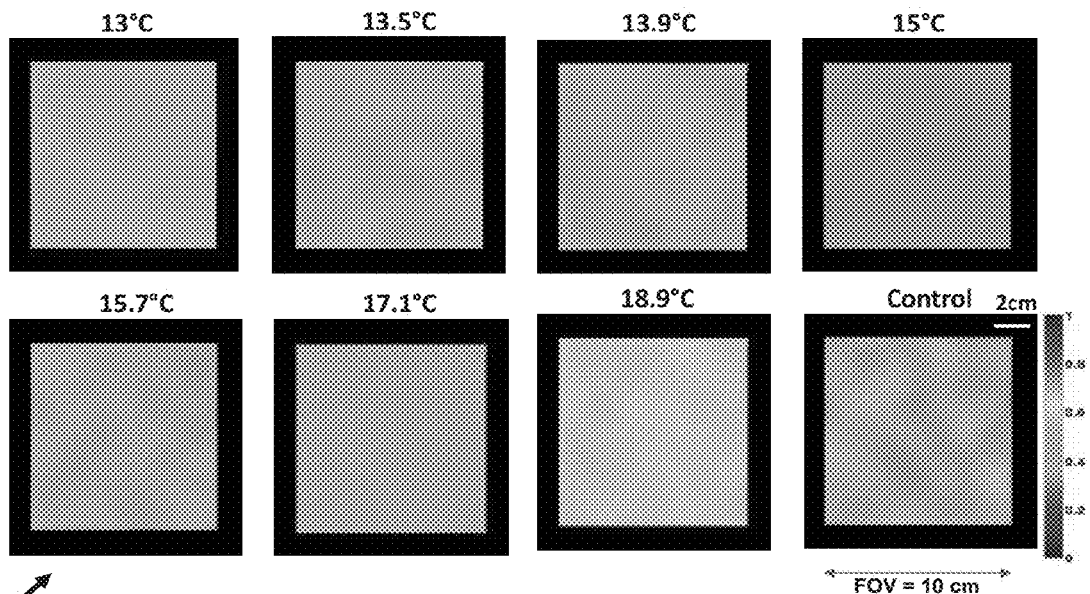
FIG. 12A illustrates a comparison of $^{17}$O MRSI noise images acquired at 10.5 T with the BST-based tuHDC (x=0.6) ceramic block under varied block temperature as compared to the control condition without the tuHDC block at the room temperature (20° C.), showing a temperature-dependent denoising effect and reaching a maximum denoising effect at 15° C. in accordance with an embodiment.
Figure 12B:
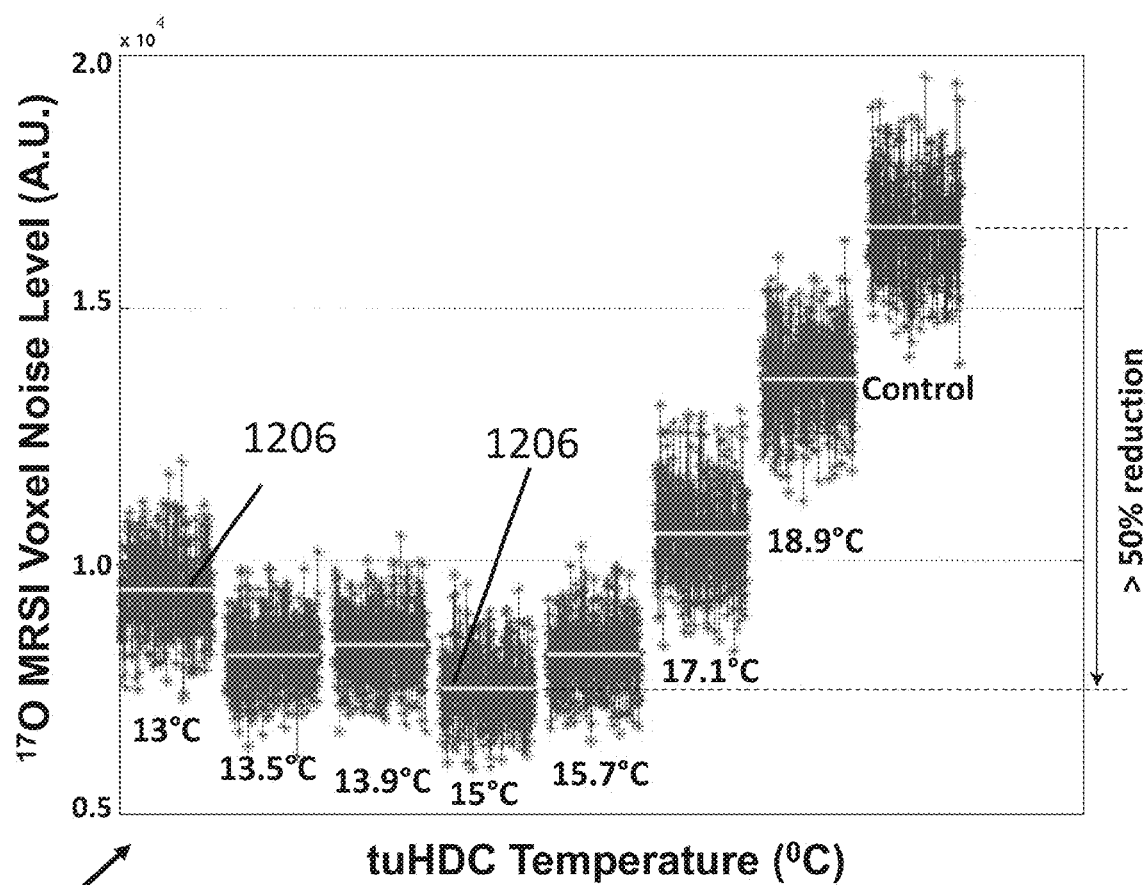
FIG. 12B illustrates a comparison of $^{17}$O MRSI voxel noises and averaged noise level acquired at 10.5 T with the BST-based tuHDC (x=0.6) ceramic block under varied tuHDC block temperature as compared to the control condition without the tuHDC block at the room temperature (20° C.), showing a temperature dependent denoising effect and reaching a maximum denoising effect at 15° C. in accordance with an embodiment.

The BST-based tuHDC ceramic resulted in a large global noise reduction for $^{17}$O MRSI application at 10.5 T across the entire imaging field of view (FOV). FIG. 12A shows representative $^{17}$O MRSI noise images 1202 acquired in the presence of the BST-based tuHDC ceramic block with varied block temperature and control without the use of the block at room temperature. The images 1202 clearly show a strong dependence of denoising effect on the block temperature (T$_b$) and the best performance (55% noise reduction) was reached at T$_b$=15° C. as quantified in the graph 1204 shown in FIG. 12B, thus, attributing doubling of SNR for $^{17}$O MRSI. FIG. 12B illustrates a comparison of $^{17}$O MRSI voxel noises and averaged noise level (lines 1206) acquired at 10.5 T with the BST-based tuHDC (x=0.6) ceramic block under varied tuHDC block temperature as compared to the control condition without the tuHDC block at the room temperature (20° C.), showing a temperature dependent denoising effect and reaching a maximum denoising effect at 15° C. in accordance with an embodiment.

Figure 13:
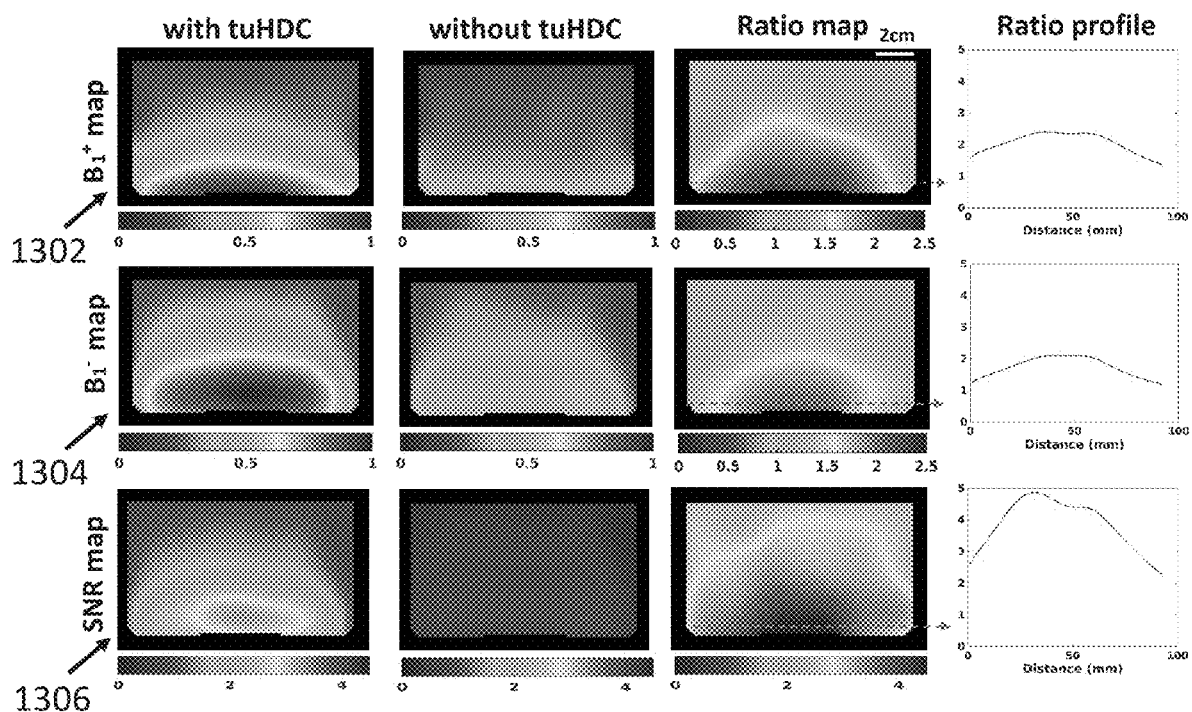
FIG. 13 illustrates representative 10.5 T 3D $^{17}$O MRSI images of $B_1^+$, $B_1^-$, SNR and their ratio maps between control at the room temperature of 20° C. and using the BST-based tuHDC (x=0.6) ceramic block at optimal block temperature of 15° C. (with maximum $B_1^+$ and $B_1^-$ strengths and denoising effect) and horizontal profiles of $B_1^+$ $B_1^-$ and SNR ratios, showing large improvements in accordance with an embodiment.

For the 3D $^{17}$O MRSI acquired at 10.5 T with the BST-based tuHDC block at 15° C., B$_1^+$ and B$_1^-$ improvements were more than doubled in the object region near the tuHDC block (as shown in graphs 1302 and 1304 in FIG. 13), and over two times reduction in the global noise (as shown in graphs 1302 and 1304 in FIG. 13), resulting in >300% SNR improvement (as shown in graph 1306 in FIG. 13). Although the improvement was spatially dependent and was determined by the magnetic field distribution attributed from the RF coil and the enhanced displacement current by the use of the tuHDC block as described by Eqs. [2] and [3], the maximum improvement in $^{17}$O MRSI SNR may reach near 400% in the object region close to the tuHDC block (shown in graph 1306 in FIG. 13), which is equivalent to increasing the magnetic field strength ($B_0$) by at least 150%, i.e., $B_0$>26 T assuming a theoretical and ideal field-dependence of the best case ($SNR \propto B_0^{7/4}$). The SNR improvement in this case was significantly attributed by the large denoising effect provided by the low-loss tuHDC block at an optimal block temperature (15° C.). Based on FIG. 5B, the optimal $\varepsilon_r$ ($\varepsilon_{r,optimal}$) for achieving the best performance at $T_b$=15° C. was determined to be extremely high (6030) for the 10.5 T $^{17}$O MRSI application at ω=60.6 MHz.

This study indicates that the properties of the (t)uHDC materials, in particular, regarding the material dielectric loss (tan δ) and self-resonant behavior, are critical to achieve high performance for MR imaging application. It is also desirable to avoid the overlapping between the RF coil operation frequency and the tuHDC self-resonant frequency via optimal design and fabrication of the (t)uHDC materials or by identifying an optimal tuHDC block temperature as guided by FIG. 6. Furthermore, the uHDC/tuHDC material with a lower tan δ can lead to a significantly larger denoising effect, thus a higher SNR.

Example 4

In this example, studies were performed to test and evaluate the tuHDC-RF-coil apparatus for a $^{23}$Na MRSI phantom study at 7 T. Sodium ($^{23}$Na) MRI provides critical information of brain pathophysiology and is a highly valuable imaging tool, especially at UHF. The same BST ($Ba_{0.6}Sr_{0.4}TiO_3$; x=0.6) based tuHDC block and the RF coil employed in the $^{17}$O MRSI study at 10.5 T (described above in Example 3, and also see the configuration in FIG. 10) were used to evaluate the following: if the highly $\varepsilon_r$-tunable tuHDC technique could be applied to a different NMR nuclide of $^{23}$Na (as an example for illustration) at a different field strength of 7 T operated at different operation frequency of 78.6 MHz, and if an optimal performance could be achieved when the block temperature was the same as the magnet room temperature, therefore, no temperature controller was needed. The $^{23}$Na MRSI phantom study was carried out on a 7 T whole-body 90-cm bore human scanner using the same setup as shown in FIG. 10 where the RF coil frequency was re-tuned from the $^{17}$O MRSI operation frequency at 60.6 MHz at 10.5 T to the $^{23}$Na MRSI operation frequency at 78.6 MHz at 7 T. Multiple 3D $^{23}$Na CSI data sets with variable RF pulse voltage were acquired under fully relaxed condition. A similar MRSI sequence and parameters as employed in the $^{17}$O MRSI study at 10.5 T were adapted for the $^{23}$Na MRSI phantom study. The SNR was calculated from the ratio between the spectral signals, i.e., the $^{23}$Na signal intensity of NaCl in different MRSI voxels, and the corresponding spectral noise level determined from the standard deviation (SD) of the spectral baseline regions without any resonance signal.

Figure 14A:
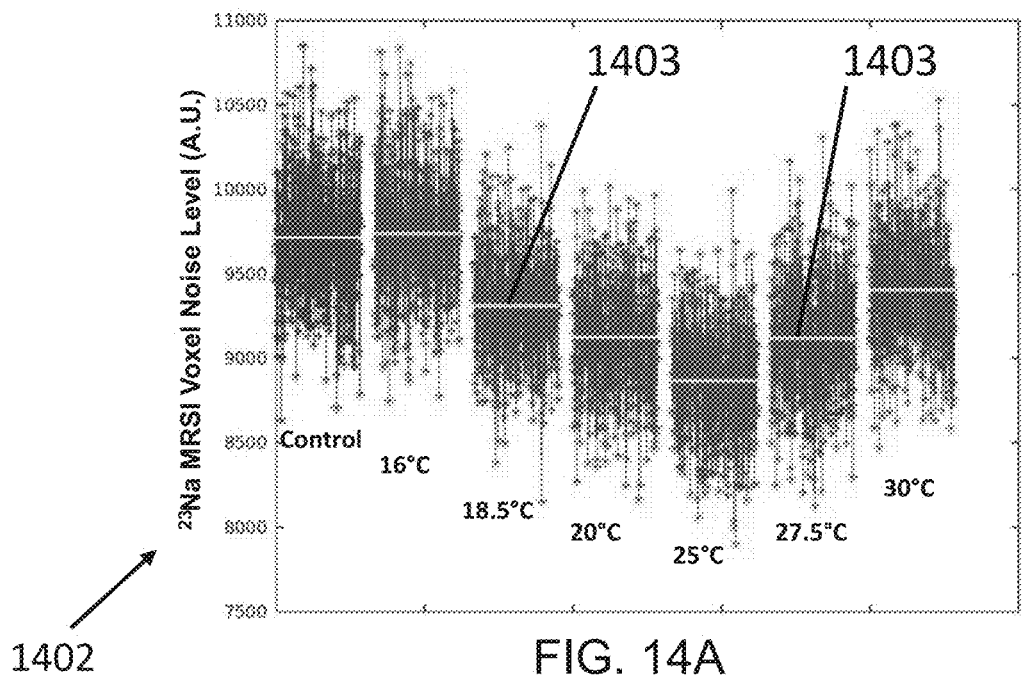
FIG. 14A illustrates a comparison of $^{23}$Na MRSI voxel noises and averaged noise level acquired at 7 T using the BST-based tuHDC (x=0.6) ceramic block under varied tuHDC block temperature as compared to the control condition acquired without the tuHDC block at the room temperature (20° C.) showing a temperature dependent denoising effect and reaching a maximum denoising effect around room temperature of 20° C. in accordance with an embodiment.
Figure 14B:
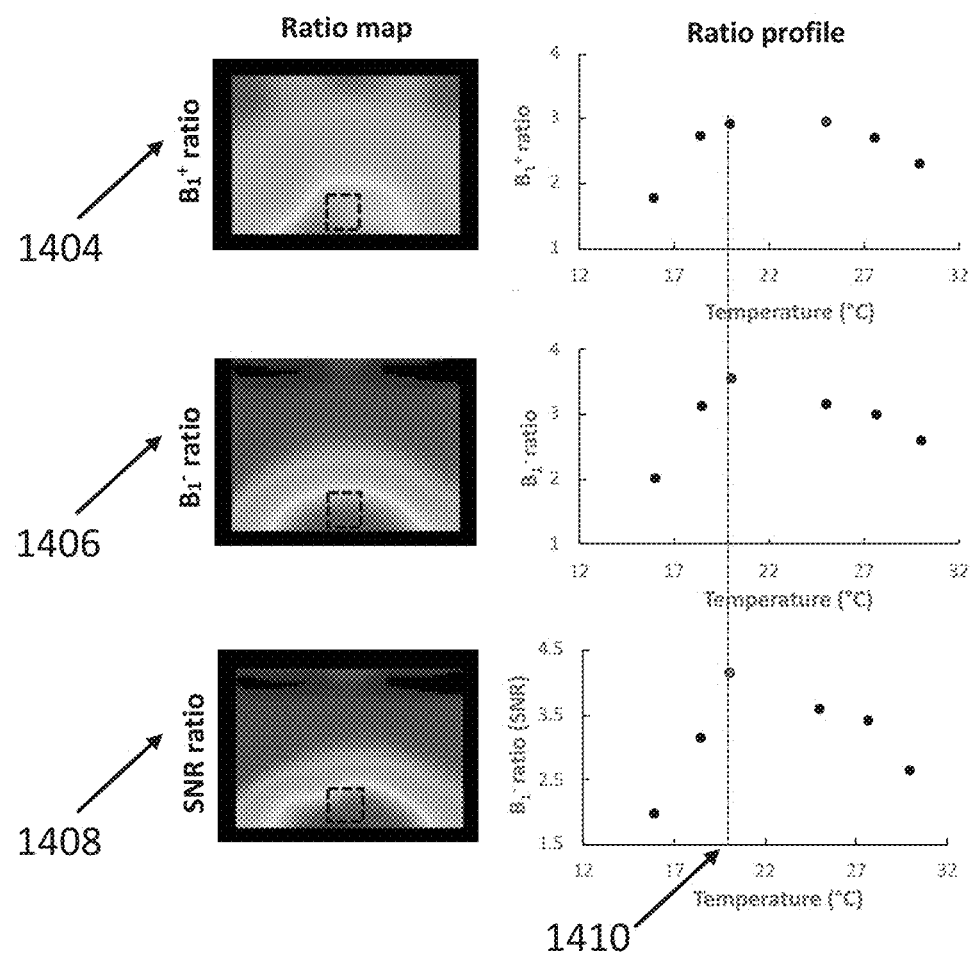
FIG. 14B illustrates representative 7 T 3D $^{23}$Na MRSI maps of $B_1^+$, $B_1^-$, SNR ratios between using the BST-based tuHDC (x=0.6) ceramic block at optimal block temperature of 20° C. (with maximum $B_1^+$ and $B_1^-$ strengths and denoising effect) and control without the tuHDC block at the room temperature of 20° C., and their temperature dependence, showing large improvements at room temperature of 20° C. in accordance with an embodiment.

FIG. 14A shows a graph 1402 of a quantitative comparison of voxel-based $^{23}$Na MRSI noise levels between the imaging conditions with the tuHDC block at varied block temperature and the control condition at the room temperature in the absence of the tuHDC block. In FIG. 14A, averaged noise levels are shown by lines 1403. The noise levels of the $^{23}$Na MRSI voxels were temperature dependent and showed a significant global denoising effect (~10%) at $T_b$ of 20-28° C. across the entire phantom with the tuHDC block, although the effect was less pronounced as compared to that of $^{17}$O MRSI at 10.5 T. FIG. 14B shows the representative ratio (between w/ and w/o the tuHDC block) maps of $B_1^+$ 1404, $B_1^-$ 1406, and SNR 1408 (left panels), and their $T_b$-dependent profiles 1410 (right panels) measured in the central $^{23}$Na MRSI voxel (dashed box). First, the improvements in $B_1^+$, $B_1^-$, SNR and denoising effect for $^{23}$Na MRSI using the BST-based tuHDC block are highly $T_b$-dependent and the results collectively indicate optimal block temperature ($T_b$) for best performance was near the room temperature of around 20° C. (see graphs 1410 in FIG. 14B) for achieving maximum improvements of more than 200% for $B_1^+$, over 250% for $B_1^-$, and larger than 300% for SNR. The $\varepsilon_{optimal}$ value for 7 T $^{23}$Na MRSI application (ω=78.6 MHz) at room temperature was ~4500.

Since the operation frequency of $^{23}$Na at 7 T (78.6 MHz) is higher than that of $^{17}$O at 10.5 T (60.6 MHz), requiring a relatively low $\varepsilon_{optimal}$ value, the optimal tuHDC block temperature for $^{23}$Na application shifted higher accordingly to 20° C. as compared to that of 10.5 T $^{17}$O application at 15° C. This study indicates the possibility for designing and optimizing the tuHDC property to achieve the best performance at the room temperature, thus, no temperature control unit would be required for MRI and MRS(I) applications.

Example 5

In this example, another study was conducted to evaluate the benefit of BST-based tuHDC blocks (x=0) for improving $^1$H MRI performance on a clinical 1.5 T scanner. All $^1$H MRI experiments were carried out on a 1.5 T whole-body/70-cm bore human scanner using a commercial $^1$H human head coil with 16-channel receiver array operating at 64 MHz. Due to the clinical MRI setup, the $^1$H coil was not retuned/matched with/without the use of the tuHDC ceramic. A similar cylindrical saline phantom and the same tuHDC ceramics as employed for the 10.5 T $^{17}$O and 7 T $^{23}$Nastudesi (described above in Examples 3 and 4) were used. The ceramics were refrigerated to ~10° C. before taking out for the $^1$H MRI phantom experiment during which it's temperature slowly increased towards room temperature. The $^1$H MRI data were acquired using a multiple-slice FLASH (Fast Low Flip Angle Shot) sequence with the following parameters: TR/TE=40 ms/2.5 ms, FA=20 degree, FOV=256 mm×256 mm, slice thickness=10 mm, image matrix=128×128×7, number of averages=2, multiple images were acquired with varied RF pulse voltages for $B_1$ mapping.

The low-loss BST-based tuHDC ceramics improve $B_1$ fields and SNR for $^1$H MRI on a 1.5 T clinical scanner. For this study, it was hypothesized that the performance of the tuHDC-RF-coil technology is determined by the MR imaging operation (or Larmor) frequency and corresponding $\varepsilon_{r,optimal}$, thus the same BST-based tuHDC ceramics could be applied to $^1$H MRI at lower field operated at under 100 MHz. Since the γ ratio between 41 and $^{17}$O nuclides is approximately 7, the $^1$H MRI operation frequency at 1.5 T (64 MHz) is very close to that of $^{17}$O MRSI at 10.5 T (60.6 MHz), therefore, this study was used to examine whether 41 MRI on a 1.5 T clinical scanner could also benefit significantly from the tuHDC-RF-coil technology.

Figure 15A:
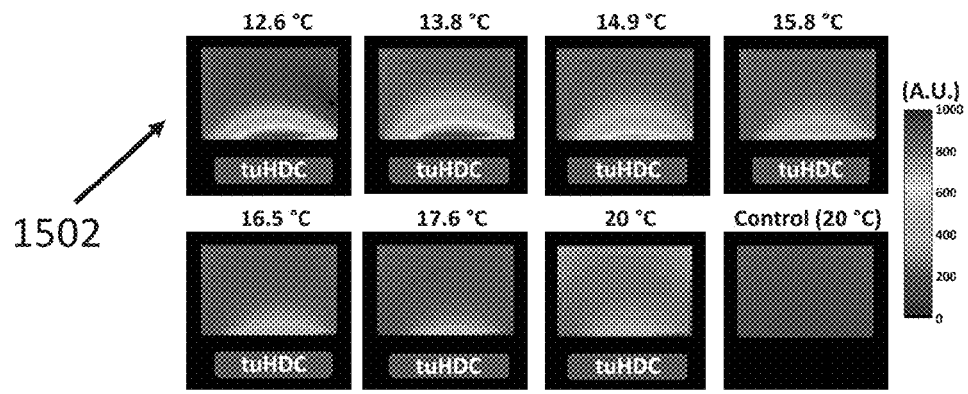
FIG. 15A illustrates $^1$H MRI intensity dependence on the temperature of the BST-based tuHDC (x=0.6) ceramic block acquired at a clinical MM scanner at 1.5 as compared to the control without using the tuHDC block at the room temperature in accordance with an embodiment.
Figure 15B:
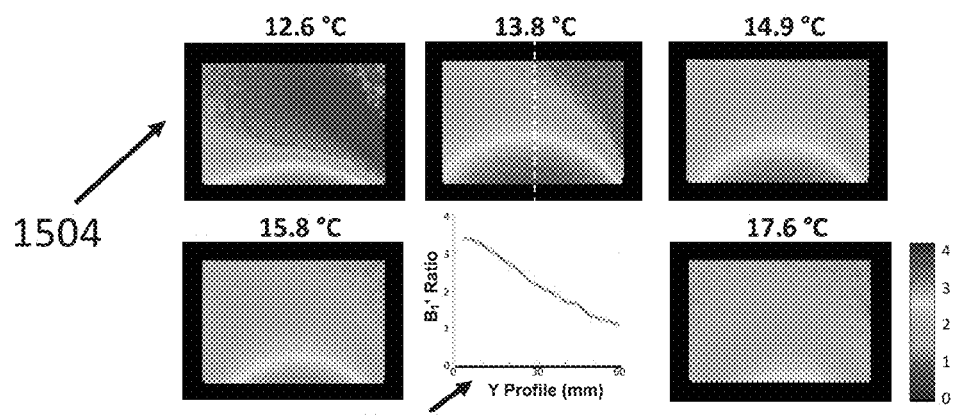
FIG. 15B illustrates $^1$H MRI $B_1^+$ ratio maps between the use of the BST-based tuHDC (x=0.6) ceramic block acquired at a clinical MRI scanner at 1.5 as compared to the control without using the tuHDC block at the room temperature and dependence on the tuHDC block temperature, and vertical $B_1^+$ profile at optimal block temperature of 13.8° C. in accordance with an embodiment.
Figure 15C:
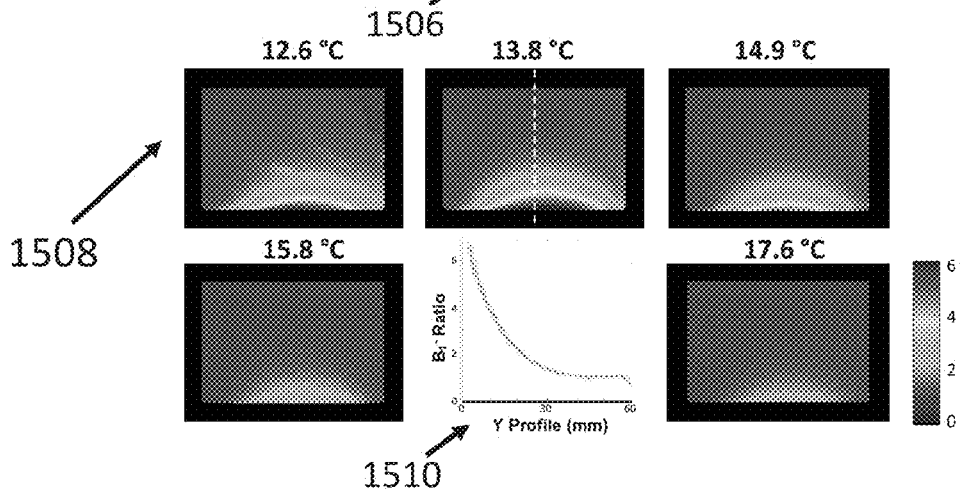
FIG. 15C illustrates $^1$H MRI $B_1^-$ ratio maps between the use of the BST-based tuHDC (x=0.6) ceramic block acquired at a clinical MRI scanner at 1.5 as compared to the control without using the tuHDC block at the room temperature and dependence on the tuHDC block temperature, and vertical $B_1^+$ profile at optimal block temperature of 13.8° C. in accordance with an embodiment.

In this study, a large MRI signal enhancement was evident at $T_b<T_{room}$, and it reached a maximum at $T_b\approx14°$ C. (as shown in graph 1502 in FIG. 15A), corresponding to $\varepsilon_{r, optimal}\approx6400$. The study shows more than 200% $B_1^+$ enhancement (shown in graphs 1504 and 1506 in FIG. 15B) and $B_1^-$ ($\propto$SNR) increased over 200-500% (as shown in graphs 1508 and 1510 in FIG. 15C) in the object region near the tuHDC ceramic. The optimal values of $\varepsilon_{r, optimal}\approx6400$ and $T_b\approx14°$ C. for 1.5 T $^1$H MRI application are similar to the 10.5 T $^{17}$O MRSI application ($\varepsilon_{r, optimal}\approx6030$ and $T_b\approx15°$ C.) since their RF operation frequencies are close. These findings confirm that a key factor in determining optimal $\varepsilon_r$ and $T_b$ values is the operation frequency of a desired nuclide MR application at a given magnetic field strength ($B_0$).

Example 6

In an embodiment, a tuHDC-RF-coil apparatus integrates RF coils with a highly $\varepsilon_r$-tunable (from ~2000 to >15000 for a $T_b$ range of 0-40° C.) and low-loss (tan $\delta$<0.03, for 10-30° C. $T_b$) tuHDC ceramics based on the BST material (see FIGS. 2A-2B) to greatly improve the performance for broad MR imaging applications covering different field strengths and nuclides with biological significance. The tuHDC-RF-coil apparatus significantly increases the $B_1^+$ field, thereby reducing the required RF pulse power for MR imaging. For instance, a >200% $B_1^+$ improvement was observed for $^{17}$O MRSI at 10.5 T (shown in graph 1302 in FIG. 13), $^{23}$Na MRSI at 7 T (shown in graph 1404 in FIG. 14B) and $^1$H MRI at 1.5 T (shown in graphs 1504 and 1506 in FIG. 15B), thus, reducing RF pulse power by approximately 90%. Synergistically, the RF coil apparatus produces a much stronger $B_1^-$ field for various MR imaging applications, resulting in a higher detection sensitivity ($\propto B_1^-$), thus, a larger SNR gain.

In another embodiment, the (t)uHDC-RF-coil apparatus produces a large and global denoising effect of >50% for $^{17}$O MRSI at 10.5 T (shown in graph 1204 in FIG. 12B), 10% for $^{23}$Na MRSI at 7 T (shown in graph 1402 in FIG. 14A), and 43% (phantom, shown in graph 912 in FIG. 9C) and 16% (human brain, shown in graph 916 in FIG. 9E) for $^{31}$P MRSI at 7 T produced by integrating low-loss (t)uHDC materials with a RF coil(s) under an optimal condition. The denoising effect significantly improved the SNR gain under an optimal condition even when the RF coil Q was partially reduced owing to the strong interaction between the RF coil and (t)uHDC block at the optimal tuHDC block temperature (for instance, as demonstrated by the $^{17}$O MRSI study in FIGS. 7A, 7B, 11A, 11B, 12A and 12B). The large denoising effect cannot be explained by the traditional RF coil theory that links RF coil Q and noise. For the 10.5 T $^{17}$O MRSI, the maximum denoising effect was observed at $T_b=14°$ C., while the $^{17}$O RF coil Q ($\approx35$) was decreased 35% from the condition at $T_b=20°$ C. (Q$\approx54$), presumably leading to a larger noise based on traditional RF coil theory. To understand the mechanism underlying the denoising phenomenon, the relationship between MR imaging noise and E field, which consists of conservative ($E_C$) and non-conservative ($E_{NC}$) components a according to Eq. [8], was investigated.

$$E = \underbrace{-\nabla\varphi}_{conservative} - \underbrace{i\omega\vec{A}}_{non\text{-}conservative} \qquad \text{Eq. [8]}$$

where $\varphi$ is the electric scalar potential, $\vec{A}$ is the magnetic vector potential. In the near field condition, the $E_C$ in the sample contributes to the noise significantly. In addition to the enhancement of displacement current as a $B_1$ field source, the tuHDC ceramics also partially shield $E_C$ of the RF coil, which consequently, reduce the normalized noise level (NNL) from the sample according to Eq. [9].

$$NNL = \sqrt{\frac{\int \sigma |E_C|^2 dv}{avg(B_1^2)}} \qquad \text{Eq. [9]}$$

and thus, lead to the denoising effect as observed in the studies described herein. A computer RF field simulation of the $^{17}$O MRSI phantom study at 10.5 T using $\varepsilon_{r,optimal}\approx6000$ was conducted. The simulation result shows that the BST-based tuHDC ceramic reduced E field and enhanced $B_1^+$ field, which partially contributed to the large reduction of Ec field (normalized by the average $B_1^+$ in the sample). The reduced Ec field accompanying with increased $B_1^+$ results in a large NNL reduction of 62%, which is consistent with the experimentally detected noise reduction (55%, shown in graph 1204 in FIG. 12B).

Example 7

In various embodiments, the tuHDC-RF-coil apparatus provides an SNR improvement. For example, the best SNR improvement of 10.5 T $^{17}$O MRSI near the tuHDC ceramic reached 4 to 5 folds owing to the large denoising effect and $B_1^-$ enhancement, which implies that to achieve the same performance with the tuHDC-RF-coil apparatus at 10.5 T requires a much higher field strength of >26 T according to the $^{17}$O SNR field dependence (SNR$\propto\gamma B_0^{7/4}$). The large $B_1^-$ or SNR improvement (5-6 times) observed in the 1.5 T 1H MRI study near the tuHDC ceramic is equivalent to either using less than ½s scan time to achieve the same MRI quality at 1.5 T; or a similar $^1$H MRI SNR ($\propto B_0$) at UHF of above 7 T. This merit should significantly improve the quality and precision of clinical MRI for diagnosis.

In various embodiments, the tuHDC-RF-coil apparatus for MR imaging applications operated at <100 MHz requires the use of an ultrahigh permittivity material, which generates a large displacement current and reduces the conservative E field contribution for a RF coil(s) and, therefore, significantly enhances the $B_1^+$ and $B_1^-$ fields and induces a large noise reduction, therefore, leading to an unprecedented SNR gain.

The similar improvements between the 1.5 T $^1$H MRI ($\omega=63.9$ MHz) and 10.5 T $^{17}$O MRSI ($\omega=60.6$ MHz) studies described above confirm that the performance of the tuHDC-RF-coil apparatus depends on the RF operation frequency and the corresponding $\varepsilon_{r,optimal}$, which can be robustly optimized by varying $T_b$ for broad MR imaging applications of different nuclides or field strengths. For example, the improvement of the $^{31}$P MRSI at 7 T with operation frequency of 120 MHz should be applicable for the $^1$H MRS application at 3 T operating at 128 MHz. For the same reason, the large improvement observed for $^{23}$Na MRSI at 7 T in this study could be translatable to in vivo $^{13}$C MRSI application at the same field strength because of their similar RF operation frequencies (78.6 MHz for $^{23}$Na, and 75 MHz for $^{13}$C; <5% difference).

Figure 16:
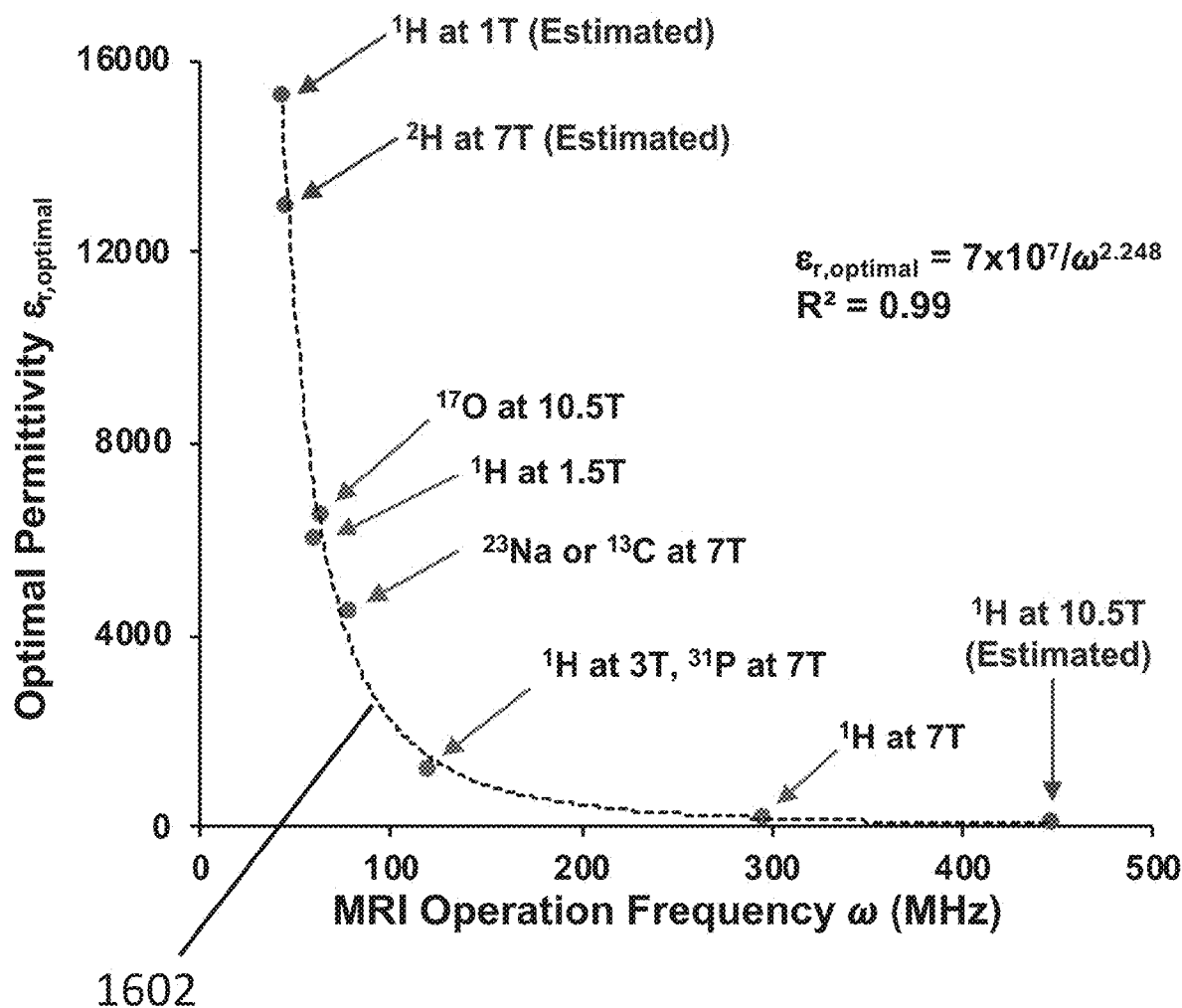
FIG. 16 is a graph illustrating the quantitative relationship between the optimal permittivity ($\varepsilon_{r,optimal}$) and the magnetic resonance operation frequency for MR imaging applications of various nuclides or magnetic field strengths in accordance with an embodiment.

FIG. 16 summarizes the regressed relationship between the RF operation frequency and the optimal permittivity of HDC/uHDC/tuHDC materials for a variety of nuclides at varied field strengths. The non-linear regression of the curve 1602 shown in FIG. 16 provides an analytical relationship between the MR imaging operation (or resonance) frequency (ω, in MHz unit) of a desired nuclide and the optimal permittivity ($\varepsilon_{r,optimal}$) of the BST-based tuHDC ceramics (x=0.6) according to the regressed Eq. [10]:

$$\varepsilon_{r,optimal} \approx \frac{7 \times 10^7}{\omega^{2.248}}.$$  Eq. [10]

The relationship between the optimal temperature ($T_{b,optimal}$) of the BST-based tuHDC ceramics and ω can be derived from Eqs. [5] and [10]:

$$T_{b,optimal} = 1.29 \times 10^{-3} \times \omega^{2.248}.$$  Eq. [11]

The $\varepsilon_{r,optimal}$ value for $^1$H MRI application at UHF of ≥7 T (or operated at ω≥298 MHz) will be much lower (<few hundreds, for instance, estimated $\varepsilon_{r,optimal}$ at ~77 for $^1$H nuclide at 10.5 T), thus, the enhancement of the displacement current as well as improvements in $B_1^+$, $B_1^-$ and SNR are anticipated to be moderate as compared to the nuclides as studies herein. In contrast, the application of $^2$H MRSI at 7 T or $^1$H MRI at 1 T operated at ω between 43-46 MHz requires an extremely high $\varepsilon_{r,optimal}$ of ~13000 or 15000 according to FIG. 16 or Eq. [10], which could be reachable for the BST-based tuHDC ceramics (x=0.6) when $T_b$ drops toward the Curie temperature ($T_c \approx 0°$ C., FIG. 2A). For instance, the optimal $T_b$ for $^2$H MRSI application at 7 T (ω=45.8 MHz) was estimated to be approximately 7° C. according to Eq. [11], which corresponds to $\varepsilon_{r,optimal}$=12957; interestingly, without passive coupling between the $^2$H RF coil resonant and tuHDC self-resonant frequencies (~6 MHz apart, FIG. 6).

In various embodiments, $\varepsilon_r$-tunable low-loss tuHDC materials (using the $Ba_xSr_{1-x}TiO_3$ ceramics as a testing block) may be integrated with RF coils and a temperature-controlling system. As discussed above, a large range of the dielectric $\varepsilon_r$ value variations to >10 thousands with a small temperature change (0-40° C., FIG. 2A) was demonstrated. Such tenability of permittivity could be used to robustly identify the temperature of tuHDC block(s) with the desired shape and size for achieving an optimal $\varepsilon_r$ value for a particular MR imaging application as demonstrated herein for the $^{17}$O MRSI application at 10.5 T, $^1$H MRI at 1.5 T and $^{23}$Na MRSI at 7 T using the same BST-based tuHDC block. The optimal temperature, thus, optimal $\varepsilon_r$ provided the best improvements for RF transmission and reception efficiencies, large denoising effect, and large SNR improvement.

The example studies described above demonstrate that the BST-based tuHDC block(s) may be operated at either optimal block temperature as shown in the 10.5 T $^{17}$O MRSI and and 1.5 T 1H MRI results or by adjusting the Ba/Sr ratio (x) (FIG. 1) towards an optimal permittivity for a desired nuclide application at a given field strength and room temperature or identifying a proper MR imaging operation frequency having an optimal permittivity value at room temperature as demonstrated by the $^{23}$Na MRSI study at 7 T (FIGS. 14A-14B).

In an embodiment, the similar HDC, uHDC or tuHDC technology or concept could be applied to other applications beyond biomedical imaging applications for MRI and in vivo MRS(I), for instance, to high-resolution liquid or solid NMR for chemistry, biochemistry and biology applications.

The present disclosure describes technologies for use with MR imaging including: i) to integrate low-loss high dielectric constant materials with a RF coil or multiple coils in for providing large denoising effect and large 131 field and SNR improvements in various MR imaging applications, ii) to apply and integrate the low-loss 6r-tunable uHDC materials by controlling the material temperature for tuning $\varepsilon_r$ and achieving the optimal performance in improving the RF transmission and reception efficiency, minimizing the noise level and maximizing the SNR, and iii) to apply and integrate the low-loss 6r-tunable uHDC materials by modifying the material chemical structure and/or composition for changing the $T_b$-dependent $\varepsilon_r$ curve and achieving the optimal performance in improving the RF transmission and reception efficiency, minimizing the noise level and maximizing the SNR at an optimal $T_b$ including room temperature. The technologies are robust and cost-effective and can provide unprecedented improvement under the same field strength, they can also be applied to a variety of nuclides at the same or different field strengths. The improvement could lead to high detection sensitivity and reliability, high spatial and/or temporal imaging resolution, which are essential for basic and clinical research and more importantly for clinical diagnosis.

In an embodiment, (t)uHDC materials or pads are incorporated with a RF coil or multiple coils in an MM system to improve imaging performance in multiple aspects. For example, the uHDC or tuHDC materials or pads may improve RF coil transmission and reception efficiencies, thus, reducing the RF power requirement and SAR, and enhancing MRI signal and SNR. In another example, the (t)uHDC materials may induce a large denoising effect, thus, further, increasing detection sensitivity and SNR. In a further example, the (t)uHDC materials or pads provide an effective approach for optimizing the device performance with desired (t)uHDC pad geometry and size for a variety of MRI and MRS(I) applications under varied magnetic field strengths. In an embodiment, ultrahigh dielectric constant (uHDC) materials or ceramic materials or pads with low dielectric loss are arranged close the object or subject to be imaged. In another embodiment, permittivity-tunable (or 6r-tunable) uHDC (tuHDC) materials or ceramic materials or pads with low dielectric loss are arranged close to the object or subject to be imaged. In another embodiment, a radiofrequency (RF) coil or multiple RF coils incorporate a single or multiple (t)uHDC pads for performing MR imaging with significantly improved RF coil transmission efficiency and detection sensitivity, large denoising effect and enhanced SNR. In another embodiment, a device is provided for characterizing and optimizing the tuHDC materials and properties, thus, enhancing the tuHDC efficacy and MR imaging performance. In another embodiment, experimental and numerical methods are used for optimization and identification of proper uHDC or tuHDC materials for enhancing MR imaging performance. In another embodiment, a device (e.g., a temperature controller) is provided to alter and control the tuHDC material temperature for achieving the optimal performance for MR imaging application.

The MR imaging application may include a variety of MRI, in vivo MRS and MRSI from NMR nuclides of biological interest at varied magnetic field strengths based on 2D, 3D imaging methods and or other localization methods. The dielectric materials or pads may consist of a material with a permittivity that is tunable in a large range of 40 to 16,000 or beyond by varying the material properties, chemical structure or composites including, but not limited to, the following ceramic materials: i) the material Barium Strontium Titanate $(Ba_x,Sr_{1-x})TiO_3$ (BST) where x ranges from 0.2 to 0.8 and ii) the material Calcium Copper Titanate $(CaCu_3Ti_4O_{12})$ (CCT) based multi-phased ceramics.

In an embodiment, the uHDC and BST- and/or CCT-based tuHDC materials or ceramic pads have a low dielectric loss (tan δ<0.05), thus, high quality factor for achieving large denoising effect and MR imaging improvement. In another embodiment, a method is provided to customize formulation and optimize sinter processes to create the BST- and/or CCT-based or other types of tuHDC materials or ceramic pads with optimal permittivity and low dielectric loss to achieve best performance for MR imaging application. In another embodiment, the BST- and/or CCT-based or other types of low-loss tuHDC materials or ceramic pads may be tailored by either adjusting the dielectric material chemical and compositions or material temperature to ensure that the material temperature is operated above the Curie temperature, thus, under the paraelectric state for optimal MR imaging performance.

In an embodiment, the permittivity value ($\varepsilon_r$) of the BST- and/or CCT-based or other types of low-loss tuHDC materials or ceramic pads with large $\varepsilon_r$ tunability may be tuned and controlled across a large $\varepsilon_r$-tunable range by changing the material temperature using a temperature controller to a desired temperature for achieving optimal MR imaging performance. For example, a device consisting of a temperature controller, circulating liquid and thermal insulation may be used to control, tune and stabilize the temperature and permittivity value ($\varepsilon_r$) of the BST- and/or CCT-based or other types of low-loss tuHDC materials or ceramic pads for achieving optimal tuHDC performance and improving MR imaging quality. The temperature range of operation may be, for example, within a safe range between 0 to 40° C., though, it can be extended to a broader range using the well-designed temperature controller, thermal insulation and safety protection.

In another embodiment, the permittivity value ($\varepsilon_r$) of the BST- and/or CCT-based or other types of low-loss tuHDC materials or ceramic pads with large $\varepsilon_r$ tunability may be tuned and controlled by varying the material properties, chemical structure or composites to achieve optimal MR imaging performance at room temperature without the use of the temperature controller or at a different temperature using the temperature controller.

In another embodiment, a method is provided to incorporate the BST- and/or CCT-based or other types of low-loss tuHDC materials or ceramic pads with RF coil(s), and to optimize the material permittivity by varying and controlling the material temperature within a safe temperature range for inducing large denoising effect, thus, large MR imaging SNR. The method to incorporate the BST- and/or CCT-based or other types of low-loss tuHDC materials or ceramic pads with RF coil(s), and to optimize the material permittivity by varying and controlling the material temperature within a safe temperature range may also significantly increase the RF coil transmission field ($B_1^+$) efficiency, thus, largely reducing the required RF power input for acquiring MR imaging. The method to incorporate the BST- and/or CCT-based or other types of low-loss tuHDC materials or ceramic pads with RF coil(s), and to optimize the material permittivity by varying and controlling the material temperature within a safe temperature range may also significantly increasing the RF coil reception field ($B_1^-$) efficiency, thus, largely increasing the MRI and MRS(I) signal and detection sensitivity, ultimately, increasing SNR and/or imaging spatiotemporal resolution.

In another embodiment, the method to incorporate the BST- and/or CCT-based or other types of low-loss tuHDC materials or ceramic pads with RF coil(s), and to optimize the material permittivity by varying and controlling the material temperature within a safe temperature range may also include optimizing the temperature dependent function of the material permittivity to achieve optimal performance at a desired material temperature for increasing RF coil $B_1^+$ and $B_1^-$ efficiencies, denoising effect and maximizing SNR and/or spatiotemporal resolution for MR imaging applications.

In another embodiment, a method is provided to incorporate the BST- and/or CCT-based or other types of low-loss tuHDC materials or ceramic pads with RF coil(s), and to optimize the material permittivity by varying and controlling the material composites and chemical structure for optimizing the material permittivity to achieve optimal performance at a desired material temperature or room temperature for increasing RF coil $B_1^+$ and $B_1^-$ efficiencies, denoising effect and maximizing SNR and/or spatiotemporal resolution for MR imaging application.

In another embodiment, a calibrated method is provided that uses a RF coil or two RF pick-up coils and a RF network analyzer to measure, analyze and optimize the permittivity value of uHDC/tuHDC materials or pads at room or different temperature for improving MR imaging performance. In another embodiment, a method based on the resonator method of Hakki and Colman and the device may be used to measure, analyze and optimize the permittivity value of uHDC/tuHDC materials or pads at room or different temperature for improving MR imaging performance.

Based on the relationship between MRI/MRS(I) imaging operation frequency and optimal permittivity as guided by the regressed Eq. [10] a permittivity range of the BST-based low-loss tuHDC materials or ceramic pads between 2000-16,000 or beyond may be determined that is suitable for broad MRI/MRS applications at various magnetic field strengths and RF operating frequencies (approximately covering from up to 150 MHz) with optimal performance, for instance, for a number of nuclides at varied magnetic field strengths as shown in FIG. 16. In another embodiment, Eqs. [10] and [11], which were derived from this study, may be highly valuable to design and optimize the BST-based tuHDC-RF-coil apparatus for broad MR imaging applications as demonstrated herein. The identified $\varepsilon_{r,optimal}$ value for a particular MR imaging application can be used to determine the optimal tuHDC material temperature according to Curie-Weiss Law (Eq. [5]) for optimal MR imaging performance. FIG. 16 and Eq[08] suggest that a low RF operation frequency is associated with a much higher optimal permittivity of the dielectric constant material, thus, achieving better performance for MR imaging application owing to a largely enhanced displacement current according to Eq. [2]. Therefore, the disclosure should benefit more for the $^1H$ MRI applications at relatively low to median field strengths (e.g., ≤3 T for clinical scanners) and X-nuclear MRSI applications at high (for relatively high-γ nuclides, such as $^{31}P$ nuclide at 3 T or 7 T) and ultrahigh fields (for low-γ nuclides, such as $^{17}O$, $^2H$, $^{23}Na$ and $^{13}C$ nuclides at ≥7 T) requiring the dielectric constant material(s) with a very large permittivity.

Computer-executable instructions for tuning the permittivity of ultrahigh dielectric materials in a RF coil or multiple coils according to the above-described methods may be stored on a form of computer-readable media. Computer-readable media includes volatile and nonvolatile, removable, and non-removable media implemented in any method or technology for storage of information such as computer-readable instructions, data structures, program modules or other data. Computer-readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, modifications, and extensions, aside from those expressly stated, are possible and within the scope of the invention.

The invention claimed is:

1. An apparatus for transmitting and receiving radiofrequency (RF) signals in a magnetic resonance (MR) imaging system for proton and X-nuclear imaging, the apparatus comprising:
at least one radiofrequency (RF) coil for MR imaging;
an ultrahigh dielectric constant material incorporated within the at least one RF coil, wherein a permittivity of the ultrahigh dielectric constant material depends on a temperature of the material and is tunable; and
a temperature controller thermally coupled to the ultrahigh dielectric constant material, the temperature controller configured to control a temperature of the ultrahigh dielectric constant material to tune the permittivity of the ultrahigh dielectric constant material;
wherein a chemical structure and composition of the ultrahigh dielectric constant material is selected to control and optimize the permittivity of the ultrahigh dielectric constant material and a temperature dependence of the ultrahigh dielectric constant material.

2. The apparatus according to claim 1, wherein the ultrahigh dielectric constant material is barium strontium titanate.

3. The apparatus according to claim 1, wherein the ultrahigh dielectric constant material is calcium copper titanate.

4. The apparatus according to claim 1, wherein the ultrahigh dielectric constant material is configured as at least one pad in a form of a ceramic with a desired shape and size.

5. The apparatus according to claim 1, wherein the temperature controller comprises a liquid for providing cooling or heating to control the temperature of the ultrahigh dielectric constant material.

6. The apparatus according to claim 5, further comprising a thermal insulation disposed around the temperature controller.

7. The apparatus according to claim 1, wherein the temperature of the ultrahigh dielectric constant material is controlled within a range of 0° C. to 50° C. for human MR imaging.

8. The apparatus according to claim 1, wherein the permittivity of the ultrahigh dielectric constant material is tunable in a range of 800 to 20,000 for MR imaging applications for biologically significant nuclides at a predetermined magnetic field strength.

9. The apparatus according to claim 1, wherein the temperature of the ultrahigh dielectric constant material is controlled and optimized to produce a maximum denoising effect in MR signals detected by the at least one RF coil.

10. The apparatus according to claim 1, wherein a dielectric loss of the ultrahigh dielectric constant material is minimized to increase a denoising effect in MR signals detected by the at least one RF coil.

11. The apparatus according to claim 1, wherein the ultrahigh dielectric constant material is configured as a plurality of pads arranged in an array.

12. The apparatus according to claim 11, wherein the array is incorporated with a head or other anatomy RF coil configuration.

13. An apparatus for transmitting and receiving radiofrequency (RF) signals in a magnetic resonance imaging (MM) system, the apparatus comprising:
at least one radiofrequency (RF) coil;
a low dielectric loss ultrahigh dielectric constant material positioned within the at least one RF coil, wherein a temperature of the low dielectric loss ultrahigh dielectric constant material is optimized to produce a maximum denoising effect in MR signals detected by the at least one RF coil and increase signal-to-noise ratio (SNR) for MR imaging;
wherein a chemical structure and composition of the low dielectric loss ultrahigh dielectric constant material is selected to control and optimize a temperature dependence of the ultrahigh dielectric constant material.

14. The apparatus according to claim 13, wherein the low dielectric loss ultrahigh dielectric constant material is barium strontium titanate.

15. The apparatus according to claim 13, wherein the low dielectric loss ultrahigh dielectric constant material is configured as at least one pad with a desired shape and size.

16. The apparatus according to claim 13, wherein the low dielectric loss ultrahigh dielectric constant material is configured as a plurality of pads arranged in an array.

17. The apparatus according to claim 13, further comprising a temperature controller thermally coupled to the low dielectric loss ultrahigh dielectric constant material, the temperature controller configured to control the temperature of the low dielectric loss ultrahigh dielectric constant material, wherein the temperature of the low dielectric loss ultrahigh dielectric constant material is controlled to provide an optimal permittivity of the low dielectric loss ultrahigh dielectric constant material for maximizing the RF coil transmission efficiency and reduce RF power required for performing MR imaging with the at least one RF coil.

18. The apparatus according to claim 13, further comprising a temperature controller thermally coupled to the low dielectric loss ultrahigh dielectric constant material, the temperature controller configured to control the temperature of the low dielectric loss ultrahigh dielectric constant material, wherein the temperature of the low dielectric loss ultrahigh dielectric constant material is controlled to provide an optimal permittivity of the low dielectric loss ultrahigh dielectric constant material for maximizing the RF coil reception efficiency and MR signal detection sensitivity for the at least one RF coil.

19. The apparatus according to claim 13, further comprising a temperature controller thermally coupled to the low dielectric loss ultrahigh dielectric constant material, the temperature controller configured to control the temperature of the low dielectric loss ultrahigh dielectric constant material, wherein the temperature of the low dielectric loss ultrahigh dielectric constant material is controlled to maximize the MR signal detection sensitivity and minimize the imaging noise for improving MR imaging SNR for the at least one RF coil.

20. An apparatus according to claim 13, wherein the temperature of the low dielectric loss ultrahigh dielectric constant material is optimized based at least on an RF operation frequency of the MM system for a biologically significant nuclide of interest at a desired magnetic field strength.

21. A method for controlling and enhancing a signal-to-noise ratio of MR signals detected by at least one RF coil in a magnetic resonance imaging (MRI) system, the method comprising:
provinding an ultrahigh dielectric constant material within the at least one RF coil of the MRI system, wherein the permittivity of the ultrahigh dielectric constant material depends on a temperature of the material and is tunable; and
controlling the temperature of the ultrahigh dielectric constant material to tune and optimize the permittivity of the ultrahigh dielectric constant material;
wherein a chemical structure and composition of the ultrahigh dielectric constant material is selected to control and optimize the permittivity and a dielectric loss of the ultrahigh dielectric constant material and a temperature dependence of the ultrahigh dielectric constant material.

22. The method according to claim 21, wherein the ultrahigh dielectric constant material is barium strontium titanate.

23. The method according to claim 21, wherein the ultrahigh dielectric constant material is calcium copper titanate.

24. The method according to claim 21, wherein the ultrahigh dielectric constant material is configured as at least one pad with a desired shape and size.

25. The method according to claim 21, wherein the permittivity of the ultrahigh dielectric constant material is tunable in a range of 800 to 20,000.

26. The method according to claim 21, wherein the temperature of the ultrahigh dielectric constant material is controlled within a range of 0 to 50° C.

* * * * *

UNITED STATES PATENT AND TRADEMARK OFFICE
CERTIFICATE OF CORRECTION

PATENT NO. : 11,275,132 B2
APPLICATION NO. : 16/843681
DATED : March 15, 2022
INVENTOR(S) : Wei Chen et al.

It is certified that error appears in the above-identified patent and that said Letters Patent is hereby corrected as shown below:

In the Specification

Column 1, Line 30, "MM" should be --MRI--.

Column 2, Line 13, "MM" should be --MRI--.

Column 3, Line 14, "(CE)" should be --($\sigma$E)--.

Column 6, Line 8, "co" should be --$\omega$--.

Column 6, Line 19, "(w)" should be --($\omega$)--.

Column 8, Line 16, "MM" should be --MRI--.

Column 8, Line 22, "MM" should be --MRI--.

Column 9, Line 32, "(13i)" should be --(Bi)--.

Column 9, Line 40, "MM" should be --MRI--.

Column 9, Line 50, "MM" should be --MRI--.

Column 9, Line 59, "MM" should be --MRI--.

Column 10, Line 38, "MM" should be --MRI--.

Column 11, Line 38, "at 100" should be --at $\geq$ 100--.

Column 13, Line 38, "MM" should be --MRI--.

Signed and Sealed this
Seventeenth Day of May, 2022

Katherine Kelly Vidal
*Director of the United States Patent and Trademark Office*

Column 15, Line 26, "co" should be --$\omega$--.

Column 16, Line 8, "MM" should be --MRI--.

Column 16, Line 48, "(1)" should be --$\omega$--.

Column 22, Line 62, "41" should be --$^1$H--.

Column 25, Line 27, "co" should be --$\omega$--.

Column 26, Line 4, "131" should be --$B_1$--.

Column 26, Line 6, "6$_r$-tunable" should be --$\varepsilon_r$-tunable--.

Column 26, Line 11, "6$_r$-tunable" should be --$\varepsilon_r$-tunable--.

Column 26, Line 26, "MM" should be --MRI--.

Column 26, Line 42, "6$_r$-tunable" should be --$\varepsilon_r$-tunable--.

In the Claims

Column 30, Claim 13, Line 12, "MM" should be --MRI--.

Column 31, Claim 20, Line 4, "MM" should be --MRI--.